(12) United States Patent  
Kang et al.

(10) Patent No.: US 12,249,601 B2  
(45) Date of Patent: Mar. 11, 2025

(54) INTEGRATED CIRCUIT DEVICE, METHOD, LAYOUT, AND SYSTEM

(71) Applicant: TAIWAN SEMICONDUCTOR MANUFACTURING CO., LTD., Hsinchu (TW)

(72) Inventors: Po-Zeng Kang, Hsin-Hua (TW); Wen-Shen Chou, Zhubei (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 485 days.

(21) Appl. No.: 16/942,264

(22) Filed: Jul. 29, 2020

(65) Prior Publication Data

US 2022/0037312 A1    Feb. 3, 2022

(51) Int. Cl.
| | |
|---|---|
| *H01L 27/06* | (2006.01) |
| *G06F 30/392* | (2020.01) |
| *G06F 30/3953* | (2020.01) |
| *H01L 23/522* | (2006.01) |
| *H01L 27/02* | (2006.01) |
| *H03K 19/0944* | (2006.01) |

(52) U.S. Cl.
CPC ........ *H01L 27/0207* (2013.01); *G06F 30/392* (2020.01); *G06F 30/3953* (2020.01); *H01L 23/5226* (2013.01); *H01L 27/0629* (2013.01); *H03K 19/09441* (2013.01)

(58) Field of Classification Search
CPC ............ H01L 27/0629; H01L 27/0727; H01L 27/0738; H01L 27/0207; H01L 28/24; H01L 23/5228; H01L 28/20; H01C 17/06–20; H01C 7/006

See application file for complete search history.

(56) References Cited

U.S. PATENT DOCUMENTS

| | | | |
|---|---|---|---|
| 7,260,442 B2 | 8/2007 | Hwang et al. | |
| 8,434,032 B2 | 4/2013 | Lu et al. | |
| 9,256,709 B2 | 2/2016 | Yu et al. | |
| 2002/0123202 A1* | 9/2002 | Amishiro | H01L 27/0802 257/E27.047 |
| 2009/0023263 A1* | 1/2009 | Phan | H01L 28/20 257/E21.004 |
| 2010/0073122 A1* | 3/2010 | Le Neel | H01L 23/5228 338/25 |
| 2012/0228719 A1* | 9/2012 | Harada | H01L 27/0629 257/E27.016 |
| 2013/0140641 A1* | 6/2013 | Chuang | H01L 27/0207 257/369 |
| 2014/0040838 A1 | 2/2014 | Liu et al. | |

(Continued)

*Primary Examiner* — Younes Boulghassoul  
*Assistant Examiner* — Quinton A Brasfield  
(74) *Attorney, Agent, or Firm* — Hauptman Ham, LLP

(57) ABSTRACT

An IC device includes a transistor including a gate structure between first and second active areas, a first S/D metal portion overlying the first active area, and a second S/D metal portion overlying the second active area. A load resistor including a third S/D metal portion is positioned on a dielectric layer and in a same layer as the first and second S/D metal portions. A first via overlies the first S/D metal portion, second and third vias overlie the third S/D metal portion, and a first conductive structure is configured to electrically connect the first via to the second via.

20 Claims, 22 Drawing Sheets

(56) References Cited

U.S. PATENT DOCUMENTS

| | | | |
|---|---|---|---|
| 2014/0210014 A1* | 7/2014 | Ma | H01L 21/823475 |
| | | | 257/379 |
| 2015/0278429 A1 | 10/2015 | Chang | |
| 2016/0211860 A1* | 7/2016 | Isozaki | H03M 1/66 |
| 2017/0256529 A1* | 9/2017 | Tanuma | H01L 29/7304 |
| 2018/0061826 A1* | 3/2018 | Fujii | H01L 23/528 |
| 2018/0366461 A1* | 12/2018 | Zang | H01L 28/20 |

* cited by examiner

INTEGRATED CIRCUIT DEVICE, METHOD, LAYOUT, AND SYSTEM

BACKGROUND

An integrated circuit (IC) sometimes includes a load resistor to expand circuit capabilities beyond those provided by metal oxide semiconductor (MOS) transistors. Current mode logic (CML) and other circuits often rely on load resistors to generate voltage drops based on applied currents.

An IC typically includes a number of IC devices that are manufactured in accordance with one or more IC layout diagrams. An IC layout diagram is hierarchical and includes modules which carry out higher-level functions in accordance with the IC device's design specifications. The modules are often built from a combination of cells, each of which represents one or more IC structures configured to perform a specific function.

To form the higher-level modules and enable external connections, cells and other IC features are routed to each other by interconnect structures formed in multiple overlying metal layers. Cell placement and interconnect routing are part of an overall design process for the IC device. Various electronic design automation (EDA) tools are used to generate, revise, and verify designs for IC devices while ensuring that design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
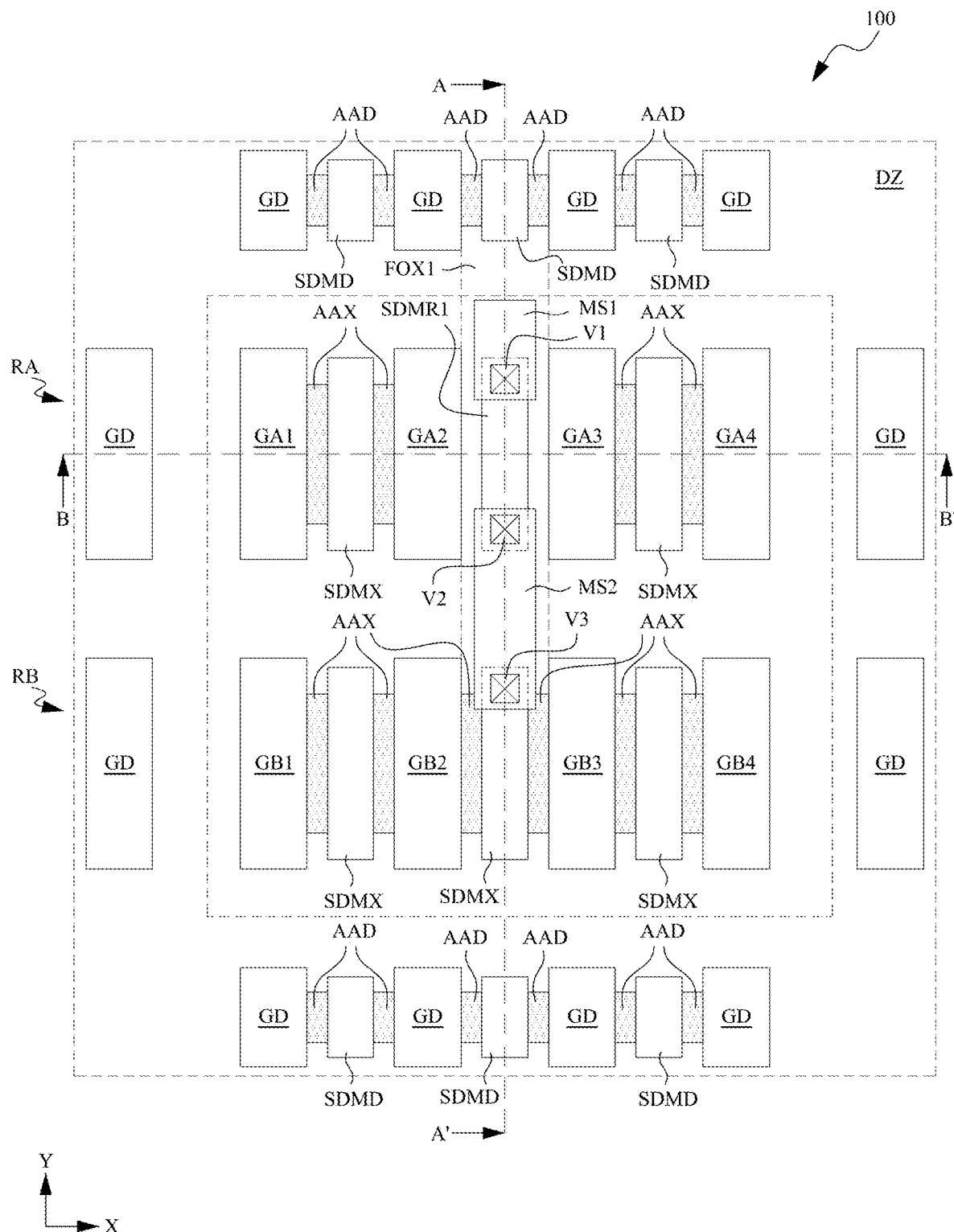
FIGS. 1A-1G are diagrams of an IC device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an IC device includes a source/drain (S/D) metal portion configured as a load resistor of an IC, e.g., a CML circuit. By including the S/D portion with other front-end-of-line (FEOL) devices, e.g., MOS transistors, the IC device has reduced area requirements and parasitic capacitance, and thereby reduced power and increased speed, compared to approaches in which another structure, e.g, a back-end-of-line (BEOL) structure such as a thin film resistor, is configured as a load resistor. In some embodiments, because the elements of an IC including the load resistor are FEOL devices, the corresponding IC layout is more easily scalable than in approaches in which a load resistor is not a FEOL device.

FIGS. 1A-1G are diagrams of an IC device 100 including a S/D metal portion SDMR1 configured as a load resistor electrically connected to a S/D metal portion SDMX capable of being included in a MOS transistor, in accordance with some embodiments. In various embodiments IC device 100 is formed by executing some or all of the operations of methods 500 and/or 600 and/or is configured based on an IC layout diagram 700A or 700B discussed below with respect to FIGS. 4-7B. In some embodiments, IC device 100 is included in an IC device 960 manufactured by an IC manufacturer/fabricator ("fab") 950, discussed below with respect to FIG. 9.

In the various embodiments, one or more S/D metal portions, e.g., S/D metal portion SDMR1, are configured as a load resistor by being positioned on corresponding dielectric layers, e.g., a dielectric layer FOX1, thereby being electrically isolated from one or more substrate portions, e.g., an active area AAX, and by being electrically connected to at least two vias, e.g., vias V1 and V2, the at least two vias thereby corresponding to load resistor terminals capable of electrically connecting the one or more S/D metal portions to other IC elements, as further discussed below.

Figure 1B:
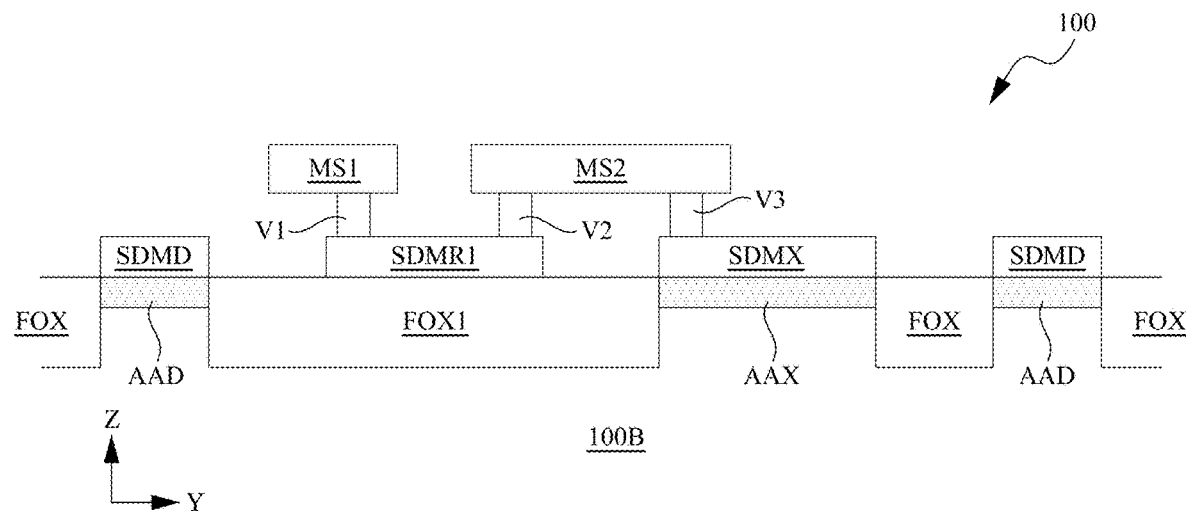
Figure 1C:
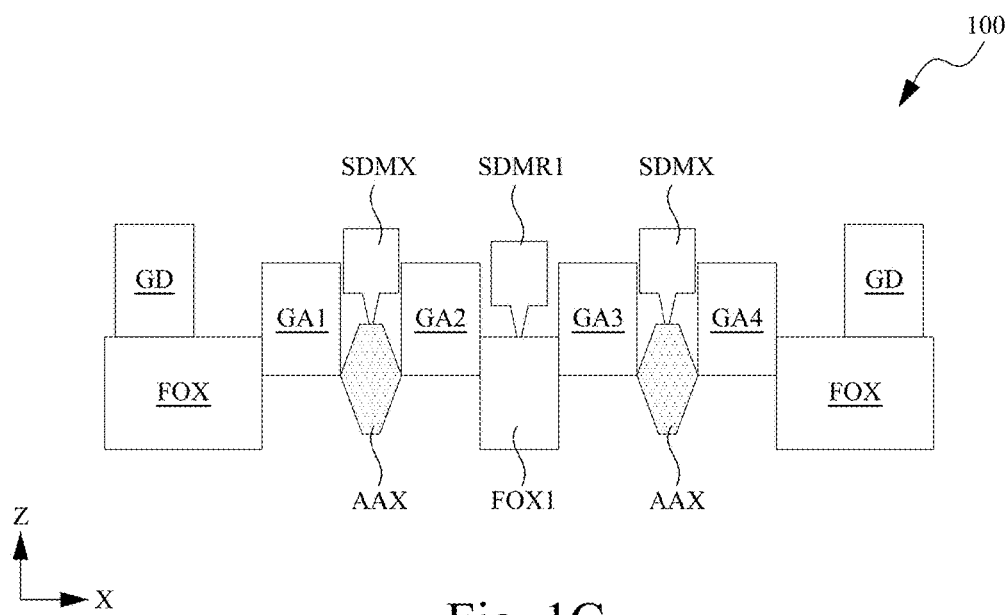
Figure 1D:
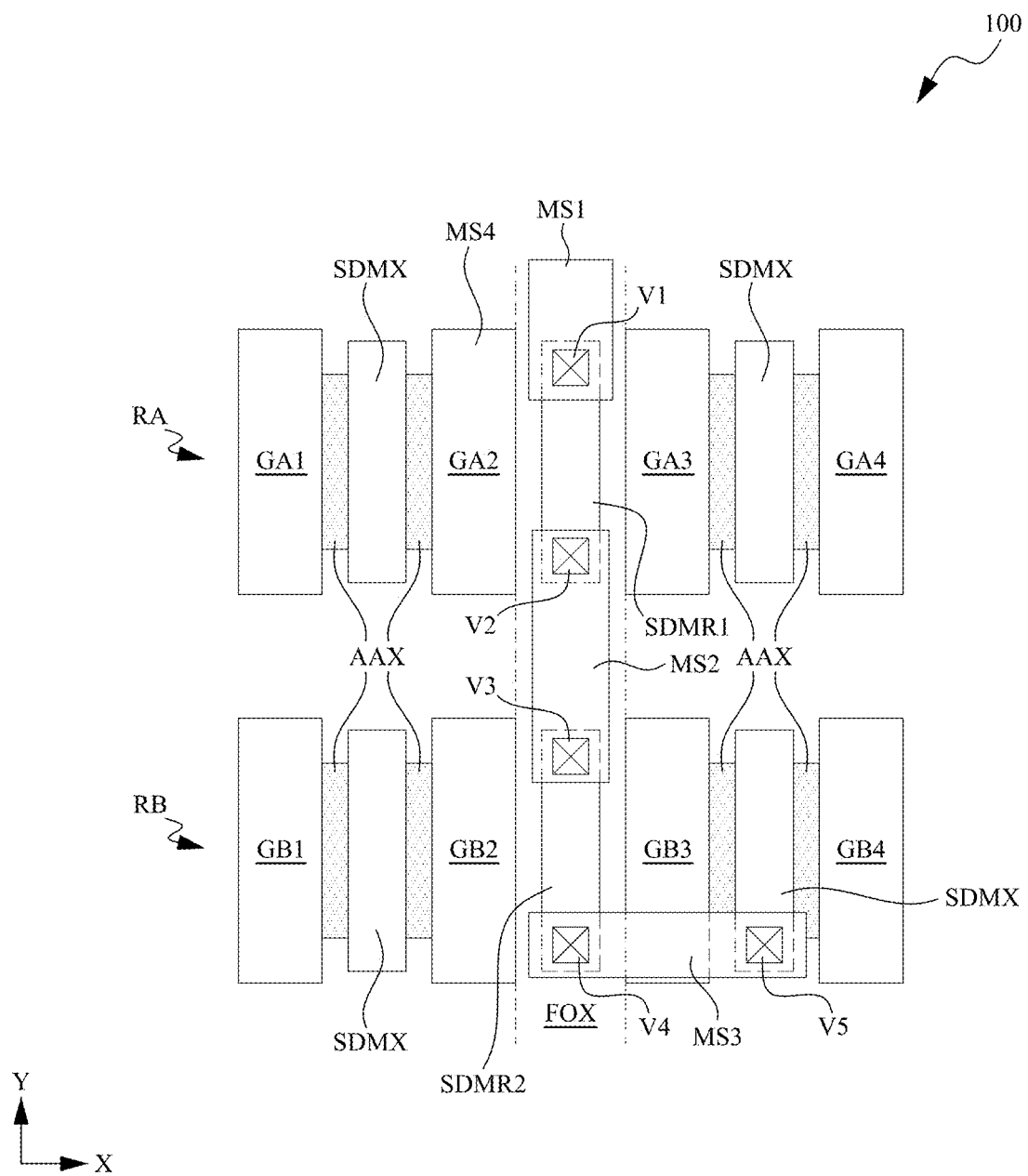
Figure 1E:
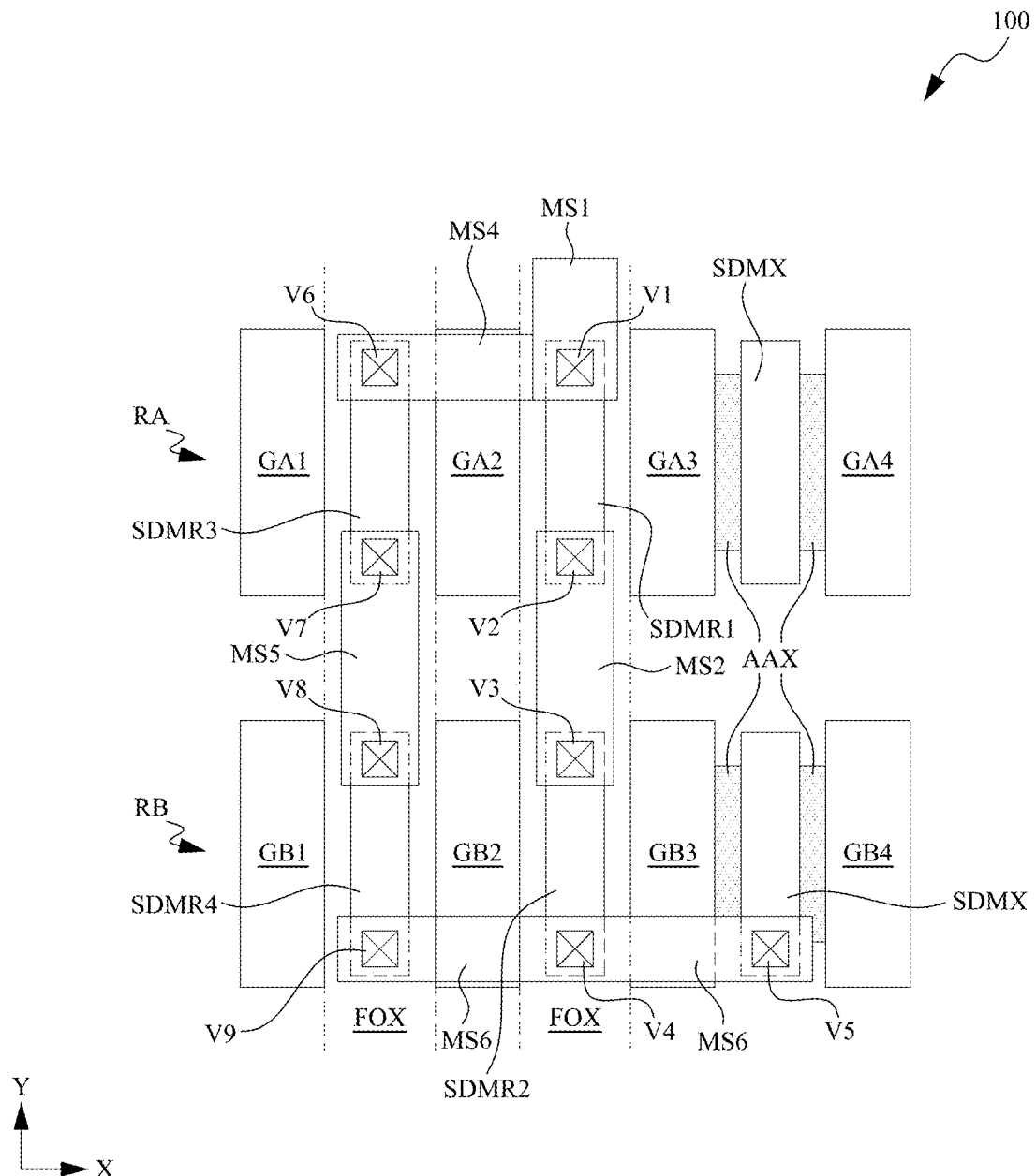
Figure 1F:
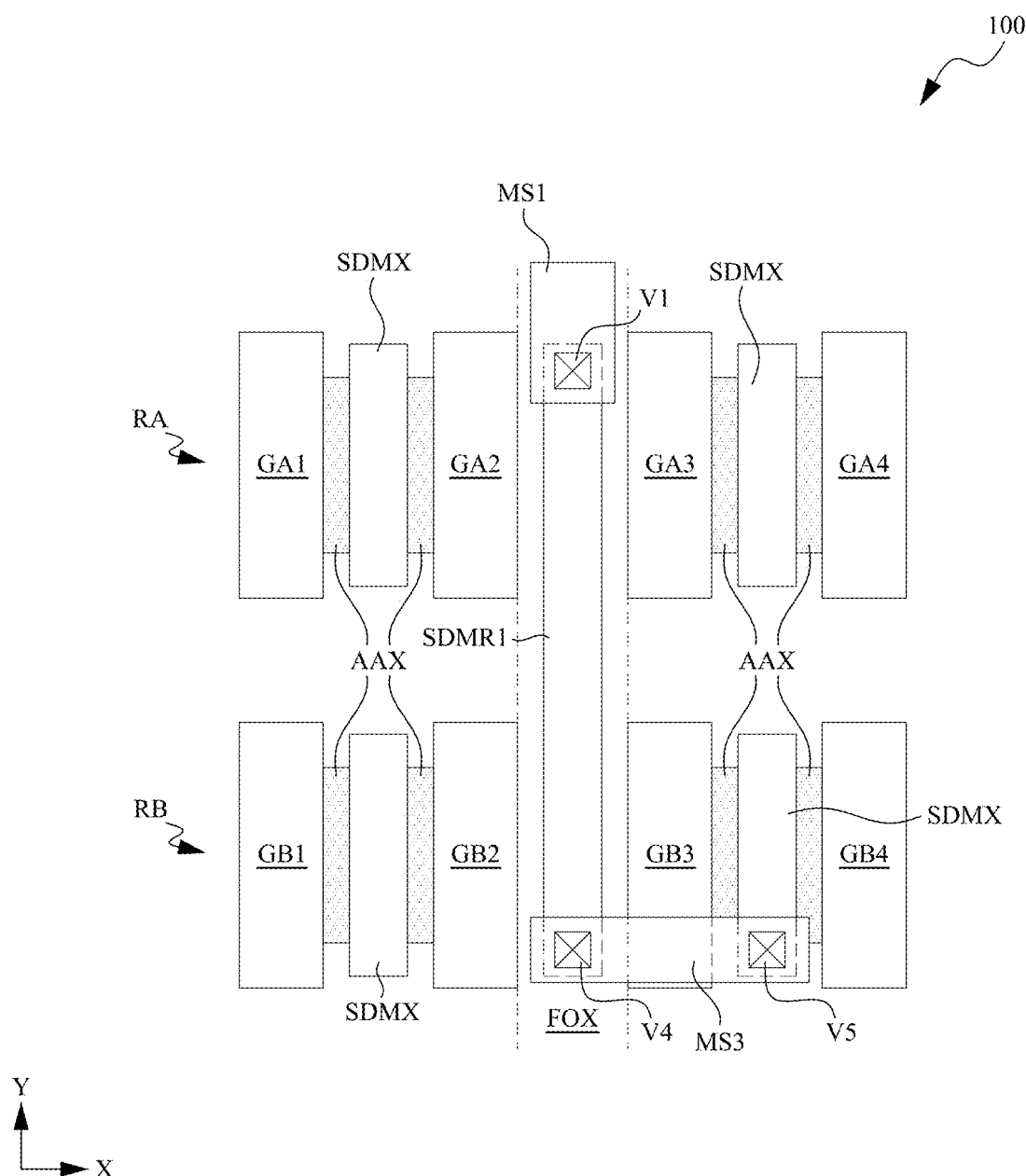
Figure 1G:
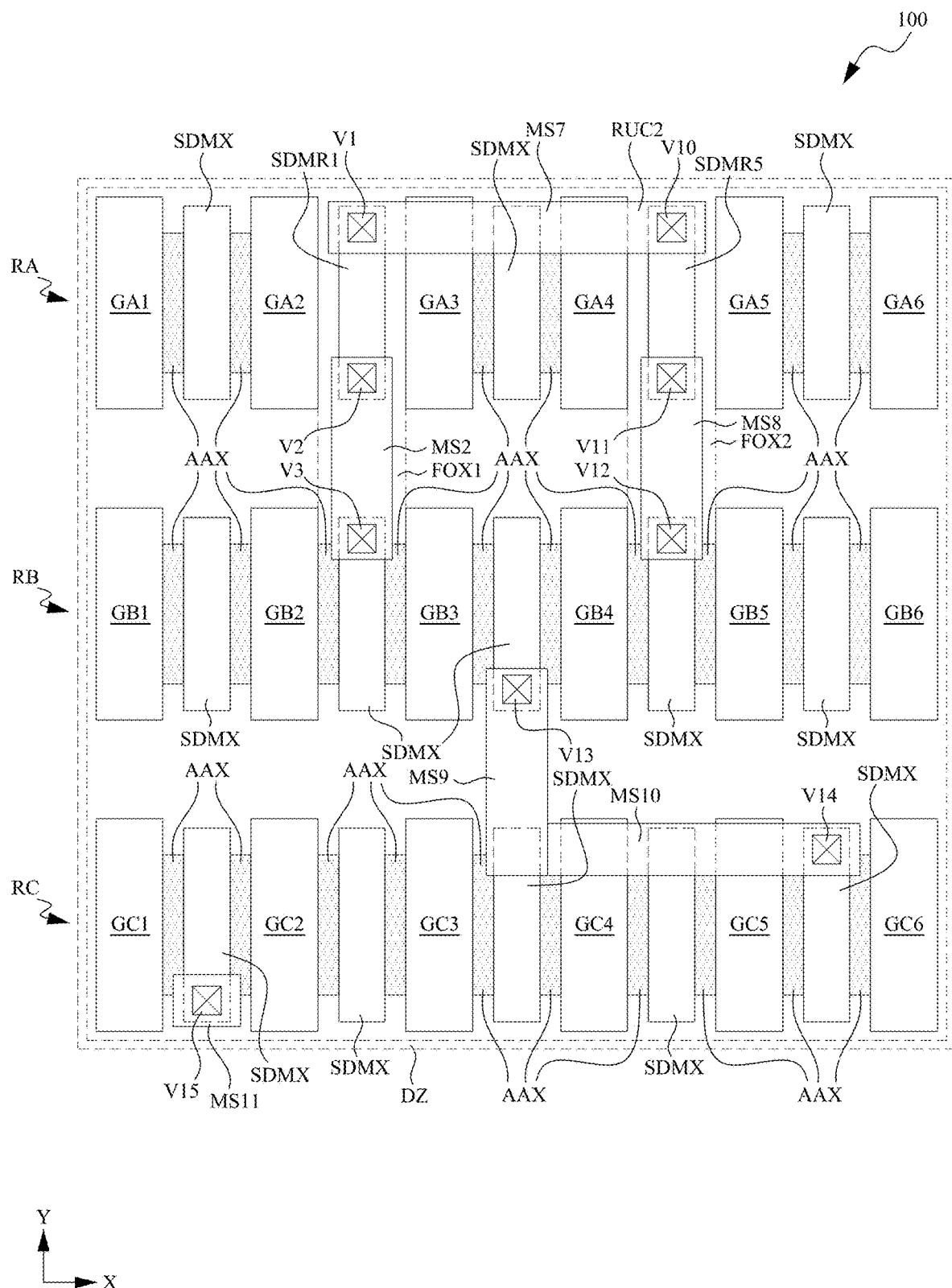

FIGS. 1A-1C depict an embodiment in which IC device 100 includes a single S/D metal portion configured as a single load resistor, FIGS. 1D and 1F depict embodiments in which IC device 100 includes multiple S/D metal portions configured as a single load resistor, FIG. 1F depicts an embodiment in which IC device 100 includes a single, extended S/D metal portion configured as a single load resistor, and FIG. 1G depicts an embodiment in which IC device 100 includes multiple S/D metal portions configured as multiple load resistors of a CML circuit.

In the embodiment depicted in FIGS. 1A-1C, FIG. 1A depicts a plan view of IC device 100 including X and Y directions, an intersection with a plane A-A' along the Y direction, and an intersection with a plane B-B' along the X direction. FIG. 1B depicts a cross-sectional view of IC device 100 along plane A-A' including the Y direction and a Z direction, and FIG. 1C depicts a cross-sectional view of IC device 100 along plane B-B' including the X and Z directions.

In each of the embodiments depicted in the plan views of FIGS. 1D-1G, IC device 100 includes corresponding features having cross-sectional profiles analogous to those depicted in FIGS. 1B and 1C corresponding to the plan view depicted in FIG. 1A. Thus, the cross-sectional profiles corresponding to the embodiments depicted in FIGS. 1D-1G are not otherwise depicted.

In the embodiment depicted in FIGS. 1A-1C, IC device 100 includes a row RA of gate structures GA1-GA4 adjacent to a row RB of gate structures GB1-GB4, each of gate structures GA1-GA4 and GB1-GB4 extending in the Y direction and overlying a substrate 100B. Active areas AAX in substrate 100B extend between each of adjacent pairs of gate structures GA1 and GA2, GA3 and GA4, GB1 and GB2, GB2 and GB3, and GB3 and GB4. S/D metal portions SDMX extend in the Y direction and overlie each of active areas AAX, and S/D metal portion SDMR1 extends in the Y direction between gate structures GA2 and GA3 and overlies dielectric layer FOX1.

In the embodiment depicted in FIGS. 1A-1C, gate structures GD, also referred to as dummy gate structures GD in some embodiments, are aligned with gate structures GA1-GA4 of row RA and gate structures GB1-GB4 of row RB in the positive and negative X directions and in the positive and negative Y directions. Active areas AAD, also referred to as dummy active areas AAD in some embodiments, are aligned with active areas AAX in the positive and negative Y directions, and S/D metal potions SDMD, also referred to as dummy S/D metal portions SDMD in some embodiments, are aligned with S/D metal portions SDMX and SDMR in the positive and negative Y directions. In some embodiments, one or more additional active areas AAD (not shown) and/or one or more additional S/D metal potions SDMD (not shown) are aligned with rows RA and/or RB in the positive and/or negative X directions. Dielectric layers FOX are positioned between the various instances of gate structures GD, active areas AAD, and S/D metal portions SDMD and the various instances of gate structures GA1-GA4 and GB1-GB4, active areas AAX, and S/D metal portions SDMX and SDMR.

Gate structures GD, active areas AAD, and S/D metal portions SDMD thereby collectively surround gate structures GA1-GA4 and GB1-GB4, active areas AAX, and S/D metal portions SDMX and SDMR. In some embodiments, the arrangement of gate structures GD, active areas AAD, and S/D metal portions SDMD is referred to as a dummy zone DZ. In some embodiments, dummy zone DZ includes a subset of gate structures GD, active areas AAD, and S/D metal portions SDMD. In some embodiments, IC device 100 does not include gate structures GD, active areas AAD, and S/D metal portions SDMD and thereby does not include dummy zone DZ.

The sizes of gate structures GD, active areas AAD, and S/D metal portions SDMD relative to those of gate structures GA1-GA4 and GB1-GB4, active areas AAX, and S/D metal portions SDMX and SDMR, respectively, are depicted in FIGS. 1A-1C for the purpose of illustration. In various embodiments, one or more of gate structures GD, active areas AAD, and S/D metal portions SDMD has a size relative to a respective one of gate structures GA1-GA4 and GB1-GB4, active areas AAX, and S/D metal portions SDMX and SDMR other than that depicted in FIGS. 1A-1C.

In the embodiment depicted in FIGS. 1A-1C, IC device 100 includes two rows of four gate structures each surrounded by dummy zone DZ. In various embodiments, IC device 100 includes dummy zone DZ surrounding a single one of rows RA or RB or one or more rows (not shown in FIGS. 1A-1F) in addition to rows RA and RB, and/or includes fewer or greater than four gate structures, e.g., gate structures GA1-GA4 or GB1-GB4, in each row.

Vias V1 and V2 overlie and are electrically connected to S/D metal portion SDMR1, a via V3 overlies and is electrically connected to an instance of S/D metal portion SDMX, a conductive segment MS1 overlies and is electrically connected to via V1, and a conductive segment MS2 overlies and is electrically connected to each of vias V2 and V3.

A first element is considered to overlie or underlie a second element based on at least a portion of the first element being aligned in the positive or negative Z direction, respectively, with at least a portion of the second element.

S/D metal portion SDMR1 is thereby configured as a resistive device including a terminal corresponding to via V1 and conductive segment MS1, and a terminal corresponding to via V2 and conductive segment MS2 and electrically connected to the instance of S/D metal portion SDMX through via V3.

The depictions of IC device 100 in FIGS. 1A-1G are simplified for the purpose of clarity. FIGS. 1A-1G depict views of IC device 100 with various features included, excluded, or having simplified shapes, and/or having simplified size, shape, and/or alignment relationships with other features, to facilitate the discussion herein. In various embodiments, IC device 100 includes one or more features (not shown), e.g., contacts, dielectric layers, vias, conductive segments, or power rails, metal interconnects, transistor elements, wells, isolation structures, or the like, in addition to the elements depicted in FIGS. 1A-1G.

Substrate 100B is a portion of a semiconductor wafer, e.g., a semiconductor wafer 953 discussed below with respect to FIG. 9, suitable for forming one or more IC devices. In various embodiments, substrate 100B includes n-type silicon (Si) including one or more donor dopants, e.g., phosphorous (P) or arsenic (As), or p-type silicon including one or more acceptor dopants, e.g., boron (B) or aluminum (Al).

Each of active areas AAX and AAD, also referred to as S/D structures AAX and AAD in some embodiments, is one or more semiconductor structures extending in the X direction between adjacent gate structures and including one or more semiconductor materials, thereby being usable as components of FET devices. In various embodiments, one or more of active areas AAX and/or AAD includes one or more of Si, indium phosphide (InP), germanium (Ge), gallium arsenide (GaAs), silicon germanium (SiGe), indium arsenide (InAs), silicon carbide (SiC), or another suitable semiconductor material. In various embodiments, an active area includes a dopant as discussed above with respect to substrate 100B.

In various embodiments, one or more of active areas AAX and/or AAD includes one or more of an epitaxial layer, a nanosheet, or other suitable semiconductor structure. The term "nanosheet" refers to a substantially two-dimensional material that is a single monolayer thick or several monolayers thick, thereby having a thickness ranging from 1 nanometer (nm) to 100 nm in some embodiments, and has lateral dimensions from, for example, hundreds of nm to greater than one micron.

In various embodiments, a S/D metal portion, e.g., S/D metal portions SDMR1, SDMX, or SDMD, is a portion of at least one metal layer, e.g., one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance. In some embodiments, a S/D metal portion is referred to as a metal-like defined (MD) segment.

In various embodiments, a S/D metal portion includes a dopant and thereby has a doping level, e.g., based on an implantation process, sufficient to cause the portion to have the low resistance level. In various embodiments, a doped S/D metal portion includes one or more of Si, SiGe, SiC, B, P, As, Ga, a metal as discussed above, or another material suitable for providing the low resistance level. In some embodiments, a S/D metal portion includes a dopant having a doping concentration of about $1*10^{16}$ per cubic centimeter ($cm^{-3}$) or greater.

In the embodiments depicted in FIGS. 1A-1G, at least one of S/D metal portions SDMR1-SDMR5 is a portion of a same metal layer as at least one of S/D metal portions SDMX and/or SDMD.

A gate structure, e.g., gate structures GA1-GA4, GB1-GB4, or GD, is an IC structure including a gate electrode (not shown). A gate electrode is a volume including one or more conductive materials at least partially surrounded by one or more dielectric layers (not shown) including one or more dielectric materials configured to electrically isolate the one or more conductive materials from overlying, underlying, and/or adjacent structures, e.g., an active area AAX.

Conductive materials include one or more of polysilicon, copper (Cu), aluminum (Al), tungsten (W), cobalt (Co), ruthenium (Ru), or one or more other metals, and/or one or more other suitable materials. Dielectric materials include one or more of silicon dioxide ($SiO_2$), silicon nitride ($Si_3N_4$), and/or a high-k dielectric material, e.g., a dielectric material having a k value higher than 3.8 or 7.0 such as aluminum oxide ($Al_2O_3$), hafnium oxide ($HfO_2$), tantalum pentoxide ($Ta_2O_5$), or titanium oxide ($TiO_2$), or another suitable material.

By the configuration discussed above, a given gate structure and adjacent active areas are arranged as components of a MOS field effect transistor (FET) in which a voltage on the corresponding gate electrode is capable of controlling conduction between the adjacent active areas having either n-type or p-type doping. In various embodiments, the gate structures are thereby arranged as NMOS transistors, PMOS transistors, or combinations of NMOS and PMOS transistors.

A channel length of a MOS transistor is determined by a gate length of a given gate structure included in the MOS transistor. In the embodiments depicted in FIGS. 1A-1G, each gate structure has a same gate length such that each MOS transistor has a same channel length. In various embodiments, one or more gate structures has a gate length different from one or more gate lengths of one or more other gate structures such that the corresponding MOS transistors have one or more channel lengths different from one or more channel lengths of the one or more other corresponding MOS transistors.

A via, e.g., vias V1, V2, or V3, is an IC structure including one or more conductive materials configured to electrically connect an underlying IC structure, e.g., a S/D metal portion SDMR1 or SDMX, to an overlying metal segment, e.g., conductive segment MS1 or MS2. A conductive segment, e.g., conductive segment MS1 or MS2, is an IC structure including one or more conductive materials configured to electrically connect one or more adjacent, underlying, and/or overlying IC structures to one or more additional adjacent, underlying, and/or overlying IC structures. In some embodiments, a conductive segment is a segment of a first metal layer of a manufacturing process used to form a metal interconnect structure.

A dielectric layer, e.g., dielectric layer FOX or FOX1, is an IC structure including one or more dielectric materials configured to electrically isolate one or more adjacent, underlying, and/or overlying IC structures from one or more additional adjacent, underlying, and/or overlying IC structures. In some embodiments, a dielectric layer is referred to as a field oxide.

In the embodiment depicted in FIGS. 1A-1C, IC device 100 includes dielectric layer FOX1 extending between gate structures GA2 and GA3 and between an instance of S/D metal portion SDMD in the positive Y direction to an instance of S/D metal portion SDMX in the negative Y direction, and is thereby configured to electrically isolate overlying S/D metal portion SDMR1 from underlying IC structures, e.g., substrate 100B. In various embodiments, IC device 100 includes dielectric layer FOX1 otherwise configured to electrically isolate overlying S/D metal portion SDMR1 from underlying IC structures.

By the configuration discussed above, IC device 100 includes S/D metal portion SDMR1 configured as a resistive device electrically connected to an instance of S/D metal portion SDMX in a same layer as S/D metal portion SDMR1. Because the instance of S/D metal portion SDMX is capable of being included in one or more MOS transistors based on adjacent gate electrodes GB2 and GB3, IC device 100, includes S/D metal portion SDMR1 capable of being configured as a load resistor of a circuit including the one or more MOS transistors.

Because S/D metal portion SDMR1 and the one or more MOS transistors are FEOL devices, IC device 100 has reduced area requirements and parasitic capacitance, and thereby reduced power and increased speed, compared to approaches in which another structure, e.g., a BEOL structure such as a thin film resistor, is configured as a load resistor.

In the embodiment depicted in FIGS. 1A-1C, simplified for the purpose of illustration, IC device 100 includes S/D metal portion SDMR1 positioned in row RA electrically connected to a single instance of S/D metal portion SDMX positioned in adjacent row RB. In various embodiments, IC device 100 includes S/D metal portions SDMR1 and SDMX positioned in a same row or in non-adjacent rows. In some embodiments, IC device 100 includes S/D metal portion SDMR1 electrically connected to one or more instances of S/D metal portion SDMX in addition to a single instance as depicted in FIGS. 1A-1C.

In the embodiment depicted in FIGS. 1A-1C, IC device 100 includes S/D metal portion SDMR1 electrically connected to conductive segment MS1 through via V1 and to the instance of S/D metal portion SDMX through a single conductive segment MS2 and vias V2 and V3. In various embodiments, IC device 100 includes conductive segment MS1 otherwise configured and/or one or more additional IC structures (not shown) configured to electrically connect S/D metal portion SDMR1 to one or more circuit elements, e.g., another instance of S/D metal portion SDMX, a power rail (not shown), or a circuit element (not shown) external to IC device 100, through conductive segment MS1.

In various embodiments, IC device 100 includes one or more conductive segments (not shown) and/or vias (not shown) in addition to or instead of conductive segment MS2 and/or via V3 such that S/D metal portion SDMR1 is electrically connected to one or more circuit elements, e.g., another instance of S/D metal portion SDMX, a power rail (not shown), or a circuit element (not shown) external to IC device 100, through conductive segment MS2.

In the embodiments depicted in FIGS. 1D-1F, IC device 100 includes gate structures GA1-GA4 in row RA, gate structures GB1-GB4 in row RB, instances of active areas AAX, S/D metal portion SDMR1, instances of S/D metal portion SDMX, via V1, and conductive segment MS1, each discussed above with respect to FIGS. 1A-1C. In some embodiments depicted in FIGS. 1D-1F, IC device 100 also includes dummy zone DZ (not shown).

In the embodiment depicted in FIG. 1D, IC device 100 does not include an instance of active area AAX and an instance of S/D metal portion SDMX between gate structures GB2 and GB3, and instead includes a S/D metal portion SDMR2 electrically connected to S/D metal portion SDMR1 through vias V2 and V3 and conductive segment MS2. IC device 100 also includes a via V4 overlying and electrically connected to S/D metal portion SDMR2, a via V5 overlying and electrically connected to an instance of S/D metal portion SDMX between gate structures GB3 and GB4, and a conductive segment MS3 overlying and electrically connected to vias V4 and V5.

In the embodiment depicted in FIG. 1D, IC device 100 thereby includes S/D metal portions SDMR1 and SDMR2 overlying a dielectric layer FOX and configured in series as a resistive device, e.g., a load resistor, including a terminal corresponding to conductive segment MS1 and a terminal corresponding to conductive segment MS3 and electrically connected to the instance of S/D metal portion SDMX through via V5, and is thereby capable of realizing the benefits discussed above with respect to FIGS. 1A-1C.

In the embodiment depicted in FIG. 1E, IC device 100 includes S/D metal portion SDMR2 and vias V4 and V5 configured as discussed above with respect to FIG. 1D, and does not include instances of active area AAX and S/D metal portion SDMX between gate structures GA1 and GA2 and between gate structures GB1 and GB2. IC device 100 instead includes a S/D metal portion SDMR3 between gate structures GA1 and GA2, a S/D metal portion SDMR4 between gate structures GB1 and GB2, vias V6-V9, and conductive segments MS4-MS6.

S/D metal portion SDMR3 is electrically connected to S/D metal portion SDMR1 through vias V6 and V1 and conductive segments MS4 and MS1, and is electrically connected to S/D metal portion SDMR4 through vias V7 and V8 and conductive segment MS5. S/D metal portion SDMR4 is electrically connected to S/D metal portion SDMR2 through vias V9 and V4 and conductive segment MS6, and to the instance of S/D metal portion SDMX between gate structures GB3 and GB4 through via V5 and conductive segment MS6.

In the embodiment depicted in FIG. 1E, IC device 100 thereby includes a series connection of S/D metal portions SDMR1 and SDMR2 overlying a dielectric layer FOX and arranged in parallel with a series connection of S/D metal portions SDMR3 and SDMR4 overlying a dielectric layer FOX, collectively configured as a resistive device, e.g., a load resistor, including a terminal corresponding to conductive segments MS1 and MS4, and a terminal corresponding to conductive segment MS6 and electrically connected to the instance of S/D metal portion SDMX through via V5, and is thereby capable of realizing the benefits discussed above with respect to FIGS. 1A-1C.

In the embodiment depicted in FIG. 1F, IC device 100 includes vias V4 and V5 and conductive segment MS3 configured as discussed above with respect to FIG. 1D, and does not include S/D metal portion SDMR2, vias V2 and V3, and conductive segment MS2. IC device 100 instead includes S/D metal portion SDMR1 extending both between gate structures GA2 and GA3 and between gate structures GB2 and GB3.

In the embodiment depicted in FIG. 1F, IC device 100 thereby includes S/D metal portion SDMR1 overlying a dielectric layer FOX and configured as a resistive device, e.g., a load resistor, including a terminal corresponding to conductive segment MS1 and a terminal corresponding to conductive segment MS3 and electrically connected to the instance of S/D metal portion SDMX through via V5, and is thereby capable of realizing the benefits discussed above with respect to FIGS. 1A-1C.

The embodiments depicted in FIGS. 1A-1F are non-limiting examples of IC device 100 including one or more S/D metal portions configured as a resistive device and in a same layer as one or more S/D metal portions configured as elements of one or more MOS transistors. In various embodiments, IC device 100 includes one or more S/D metal portions otherwise configured as a resistive device and in a same layer as one or more S/D metal portions configured as elements of one or more MOS transistors.

In the embodiment depicted in FIG. 1G, IC device 100 includes gate structures GA1-GA4 in row RA and GB1-GB4 in row RB, instances of active areas AAX, S/D metal portion SDMR1 overlying dielectric layer FOX1, instances of S/D metal portions SDMRX, vias V1-V3, conductive segment MS2, each surrounded by dummy zone DZ and configured as discussed above with respect to FIGS. 1A-1C. IC device 100 includes dummy zone DZ also surrounding gate structures GA5 and GA6 in row RA, GB5 an GB6 in row RB, and GC1-GC6 in a row RC, additional instances of active areas AAX and corresponding S/D metal portions SDMX, a S/D metal portion SDMR5 overlying a dielectric layer FOX2, vias V10-V15, and conductive segments MS7-MS11. In some embodiments, IC device 100 does not include gate structures GD, active areas AAD, and S/D metal portions SDMD and thereby does not include dummy zone DZ as depicted in FIG. 1G.

S/D metal portion SDMR5 is electrically connected to S/D metal portion SDMR1 through vias V10 and V1 and conductive segment MS7, and is electrically connected to the instance of S/D metal portion SDMX between gate structures GB4 and GB5 through vias V11 and V12 and conductive segment MS8. The instance of S/D metal portion SDMX between gate structures GB3 and GB4 is electrically connected to the instance of S/D metal portion SDMX between gate structures GC5 and GC6 through vias V13 and V14 and conductive segments MS9 and MS10. The instance of S/D metal portion SDMX between gate structures GC1 and GC2 is electrically connected to conductive segment MS11 through via V15.

Metal segment MS7 is thereby configured as a first terminal of S/D metal portion SDMR1 configured as a first resistive device and a first terminal of S/D metal portion SDMR5 configured as a second resistive device. In some embodiments, metal segment MS7 is electrically connected to a metal segment (not shown), e.g., a power rail, configured to carry a first power supply voltage level.

Gate structure GB3 and the adjacent instances of active areas AAX and S/D metal portions SDMX are thereby configured as a first MOS transistor including a first S/D terminal corresponding to conductive segment MS2 and electrically connected to a second terminal of the first resistive device. Gate structure GB4 and the adjacent instances of active areas AAX and S/D metal portions SDMX are thereby configured as a second MOS transistor including a first S/D terminal corresponding to conductive segment MS8 and electrically connected to a second terminal of the second resistive device. The instances of active area AAX and S/D metal portion SDMX between gate structures GB3 and GB4, via V13, and metal segment MS9 are thereby configured as a shared S/D terminal of the first and second MOS transistors.

Gate structures GC2 through GC5 and the corresponding adjacent active areas AAX and S/D metal portions SDMX are thereby arranged as a MOS transistor stack including the instances of active area AAX and S/D metal portion SDMX between gate structures GC5 and GC6, via V14, and metal segment MS10 configured as a first S/D terminal electrically connected to the shared S/D terminal of the first and second MOS transistors. The instances of active area AAX and S/D metal portion SDMX between gate structures GC1 and GC2, via V15, and metal segment MS11 are thereby configured as a second S/D terminal of the MOS transistor stack. In some embodiments, metal segment MS11 is electrically connected to a metal segment (not shown), e.g., a power rail, configured to carry a second power supply voltage level.

By the configuration discussed above, the embodiment of IC device 100 depicted in FIG. 1G corresponds to a CML circuit including S/D metal portion SDMR1 configured as a first load resistor coupled in series with the first MOS transistor, S/D metal portion SDMR5 configured as a second load resistor coupled in series with the second MOS transistor, and the first and second MOS transistors collectively coupled in series with the MOS transistor stack, and is thereby capable of realizing the benefits discussed above with respect to FIGS. 1A-1C. By including the MOS transistor stack, the embodiment of IC device 100 depicted in FIG. 1G is further capable of having an extended output impedance bandwidth compared to approaches in which a CML circuit does not include a MOS transistor stack.

In operation, the first and second MOS transistors act as switches, and the MOS transistor stack acts as a current limiting circuit element based on a series channel resistance. Current levels through each of the load resistors, and values of the associated voltage drops, are thereby based on an open/closed status of each of the first and second MOS transistors, the series channel resistance of the MOS transistor stack, a difference between voltage levels present on conductive segments MS7 and MS11, e.g., the first and second power supply voltage levels, and the resistance values of the load resistors.

The embodiment depicted in FIG. 1G is a non-limiting example of IC device 100 configured as a CML circuit by including first and second load resistors in row RA, first and second MOS transistors in row RB and a MOS transistor stack in row RC. In various embodiments, IC device 100 is configured as a CML circuit by including first and second load resistors, first and second MOS transistors, and a MOS transistor stack otherwise arranged, e.g., spanning fewer or greater than three rows, as further discussed below with respect to FIGS. 2E-2H.

In the embodiment depicted in FIG. 1G, IC device 100 includes the MOS transistor stack including a total of four MOS transistors arranged in the single row RC. In various embodiments, IC device 100 includes the MOS transistor stack including a total of fewer or greater than four MOS transistors, the series channel resistance of the MOS transistor stack decreasing or increasing accordingly. In some embodiments, IC device 100 includes the MOS transistor stack including a total number of MOS transistors ranging from one to 200. In some embodiments, IC device 100 includes the MOS transistor stack including a total number of MOS transistors ranging from two to 100.

In various embodiments, IC device 100 includes the MOS transistor stack including MOS transistors arranged in more than one row, and including additional conductive structures, e.g., vias and conductive segments, accordingly. In some embodiments, IC device 100 includes the MOS transistor stack including MOS transistors arranged in a total number of rows ranging from two to twenty. In some embodiments, IC device 100 includes the MOS transistor stack including MOS transistors arranged in a total number of rows ranging from five to ten.

In the embodiment depicted in FIG. 1G, IC device 100 includes load resistors having resistance values based on S/D metal portions SDMR1 and SDMR5 arranged as depicted in FIG. 1G. In various embodiments, IC device 100 includes load resistors having resistance values based on other arrangements, e.g., S/D metal portions SDMR1 and SDMR2 arranged as depicted in FIG. 1D, S/D metal portions SDMR1-SDMR4 arranged as depicted in FIG. 1E, or S/D metal portion SDMR1 arranged as depicted in FIG. 1F, as further discussed below with respect to FIG. 2F.

FIGS. 2A-2D are schematic diagrams of respective IC devices 200A-200D, in accordance with some embodiments. Each of IC devices 200A-200D includes at least one load resistor and one MOS transistor, as discussed below, in accordance with one or embodiments of IC device 100 discussed above with respect to FIGS. 1A-1G, a power supply voltage level VDD, and a reference voltage level represented by the ground symbol.

IC device 200A corresponds to an NMOS CML circuit embodiment of IC device 100 depicted in FIG. 1G and includes load resistors R0 and R1 and NMOS transistors N1-N3N. Load resistors R0 and R1 include S/D metal portions, e.g., S/D metal portions SDMR1 and SDMR5, and first terminals coupled, e.g., through conductive segment MS7, to a power supply voltage node configured to carry power supply voltage level VDD. NMOS transistors N31-N3N represent an NMOS transistor stack including a number N of NMOS transistors arranged to include a source terminal coupled, e.g., through conductive segment MS11, to a reference voltage node configured to carry the reference voltage level, and a drain terminal coupled, e.g., through conductive segment MS10, to a shared source terminal of transistors N1 and N2, e.g., conductive segment MS9. NMOS transistor N1 includes a drain terminal coupled, e.g., through conductive segment MS2, to a second terminal of load resistor R0, and NMOS transistor N2 includes a drain terminal coupled, e.g., through conductive segment MS8, to a second terminal of load resistor R1.

IC device 200A is thereby configured to, in operation, receive an input signal Ip at a gate, e.g., gate structure GB3, of NMOS transistor N1, an input signal In at a gate, e.g., gate structure GB4, of NMOS transistor N2, and a bias voltage level Vbias at gates, e.g., gate structures GC2-GCS, of each NMOS transistor N31-N3N. Responsive to power supply voltage level VDD, the reference voltage level, input signals Ip and In, and bias voltage level Vbias, IC device 200A is thereby configured to generate output signal On between load resistor R0 and NMOS transistor N1, and output signal Op between load resistor R1 and NMOS transistor N2, in operation.

IC device 200B corresponds to a PMOS CML circuit embodiment of IC device 100 depicted in FIG. 1G and includes load resistors R0 and R1 and PMOS transistors P11-P3. Load resistors R0 and R1 include S/D metal portions, e.g., S/D metal portions SDMR1 and SDMR5, and first terminals coupled, e.g., through conductive segment MS7, to the reference voltage node configured to carry the reference voltage level. PMOS transistors P11-P1N represent a PMOS transistor stack including the number N of PMOS transistors arranged to include a source terminal coupled, e.g., through conductive segment MS11, to the power supply voltage node configured to carry power supply voltage level VDD, and a drain terminal coupled, e.g., through conductive segment MS10, to a shared source terminal of transistors P2 and P3, e.g., conductive segment MS9. PMOS transistor P2 includes a drain terminal coupled, e.g., through conductive segment MS2, to the second terminal of load resistor R0, and PMOS transistor P3 includes a drain terminal coupled, e.g., through conductive segment MS8, to the second terminal of load resistor R1.

IC device 200B is thereby configured to, in operation, receive input signal Ip at the gate, e.g., gate structure GB3, of PMOS transistor P2, input signal In at the gate, e.g., gate structure GB4, of PMOS transistor P3, and bias voltage level Vbias at gates, e.g., gate structures GC2-GCS, of each PMOS transistor P11-P1N. Responsive to power supply voltage level VDD, the reference voltage level, input signals Ip and In, and bias voltage level Vbias, IC device 200B is thereby configured to generate output signal On between load resistor R0 and PMOS transistor P2, and output signal Op between load resistor R1 and PMOS transistor P3, in operation.

IC device 200C corresponds to a PMOS latch circuit including IC device 200B discussed above with respect to FIG. 2B and PMOS transistors P4-P8 corresponding to MOS transistors surrounded by dummy zone DZ, if present, as discussed above with respect to FIGS. 1A-1G. PMOS transistor P4 is coupled between the power supply voltage node and source terminals of PMOS transistors P6 and P7, PMOS transistor P5 is coupled between the drain of PMOS transistor P11 and the reference voltage node, PMOS transistors P6 and P7 are cross-coupled with each other and to the second terminals of load resistors R0 and R1, and PMOS transistor P8 is coupled between the drain of PMOS transistor P4 and the reference voltage node.

IC device 200C is thereby configured to, in operation, receive input signals Ip and In as discussed above with respect to IC device 200B and FIG. 2B, bias voltage level Vbias at gates of PMOS transistors P11-P1N and P4, and complementary clock signals Ck and Ckb at the respective gates of PMOS transistors P5 and P8. Responsive to complementary clock signals Ck and Ckb, IC device 200C is thereby configured to perform a latching operation further responsive to output signals On and Op discussed above with respect to IC device 200B.

IC device 200D corresponds to a CMOS alternating current (AC) level shifting circuit embodiment of IC device 100 as depicted in FIGS. 1A-1F and includes a load resistor R2, PMOS transistors P9 and P10, NMOS transistors N4 and N5. Load resistor R2 corresponds to a resistive device including a S/D metal portion, e.g., S/D metal portion SDMR1-SDMR4, and PMOS transistors P9 and P10 and NMOS transistors N4 and N5 correspond to MOS transistors, each surrounded by dummy zone DZ, if present. A capacitive device C1, e.g., a metal-insulator-metal (MIM) capacitor, external to IC device 100 includes a first terminal electrically connected, e.g., through one or more vias and metal segments, to a first terminal of load resistor R2 and to gates of PMOS transistor P9 and NMOS transistor N4 configured as a first inverter coupled between the power supply voltage node and reference voltage node. A second terminal of load resistor R2 and an output node of the first inverter are electrically connected to gates of PMOS transistor P10 and NMOS transistor N5 configured as a second inverter coupled between the power supply voltage node and reference voltage node.

IC device 200D is thereby configured to, in operation, receive input signal Vin at a second terminal of capacitive device and, responsive to input signal Vin and regulated based on load resistor R2, generate a level-shifted output signal Vout at an output node of the second inverter.

IC devices 200A-200D depicted in FIGS. 2A-2D thereby represent non-limiting examples in which load resistors R0-R2 include S/D metal portions, e.g., S/D metal portions SDMR1-SDMR5, electrically connected to instances of S/D metal portion SDMX in a same layer as the S/D metal portion, each of IC devices 200A-200D thereby being capable of realizing the benefits discussed above with respect to FIGS. 1A-1G.

Figure 2A:
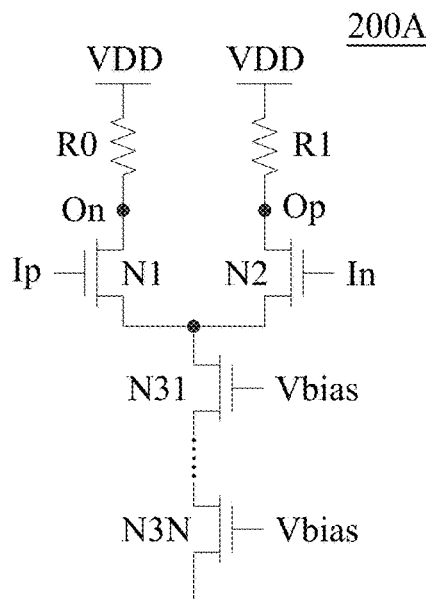
FIGS. 2A-2D are schematic diagrams of IC devices, in accordance with some embodiments.
Figure 2B:
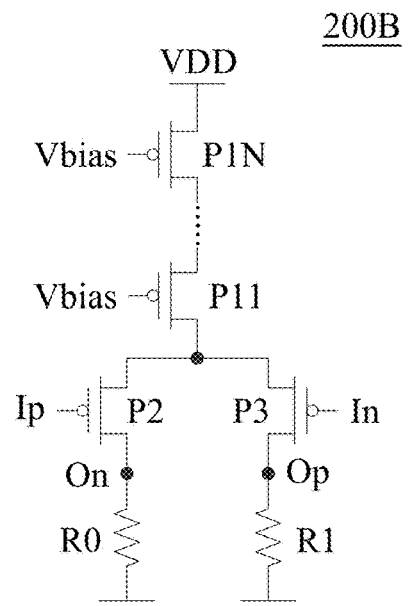
Figure 2C:
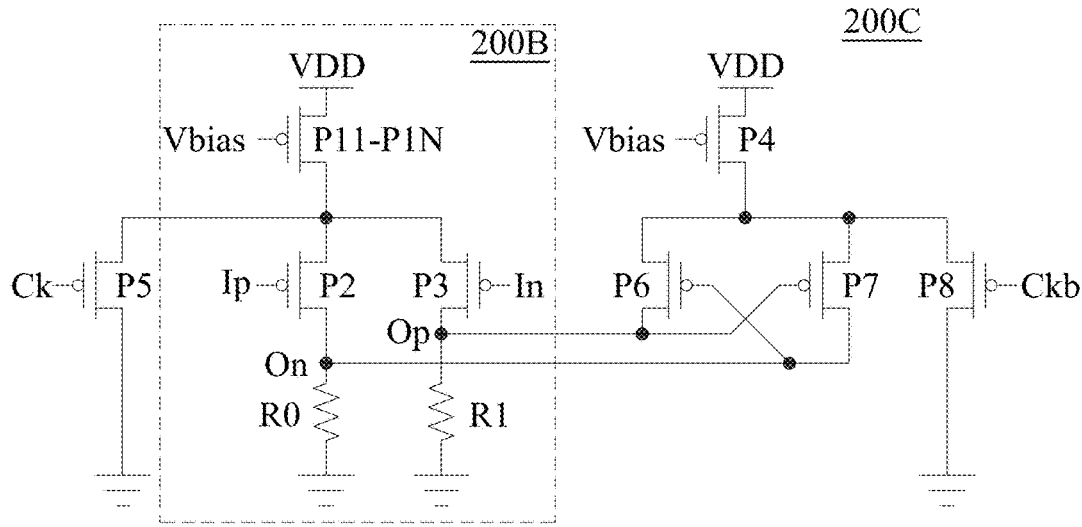
Figure 2D:
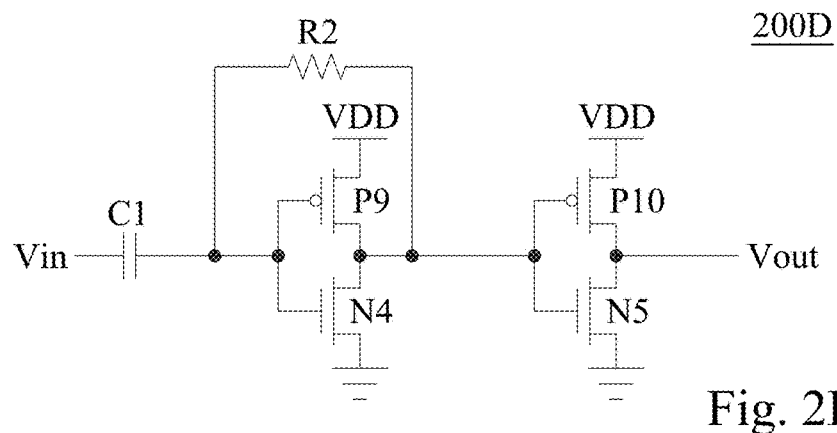
Figure 2E:
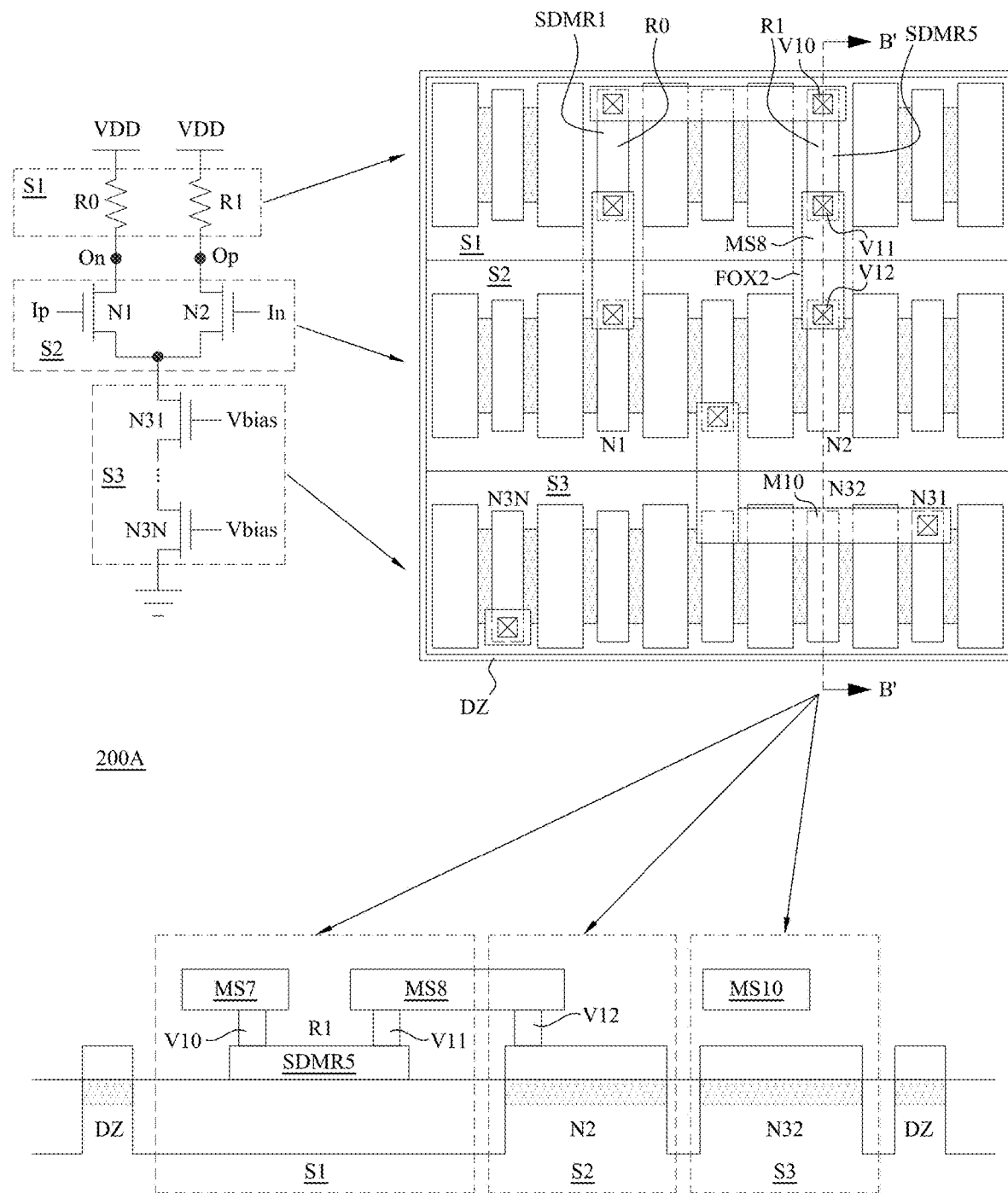
FIGS. 2E-2H are diagrams of an IC device, in accordance with some embodiments.
Figure 2F:
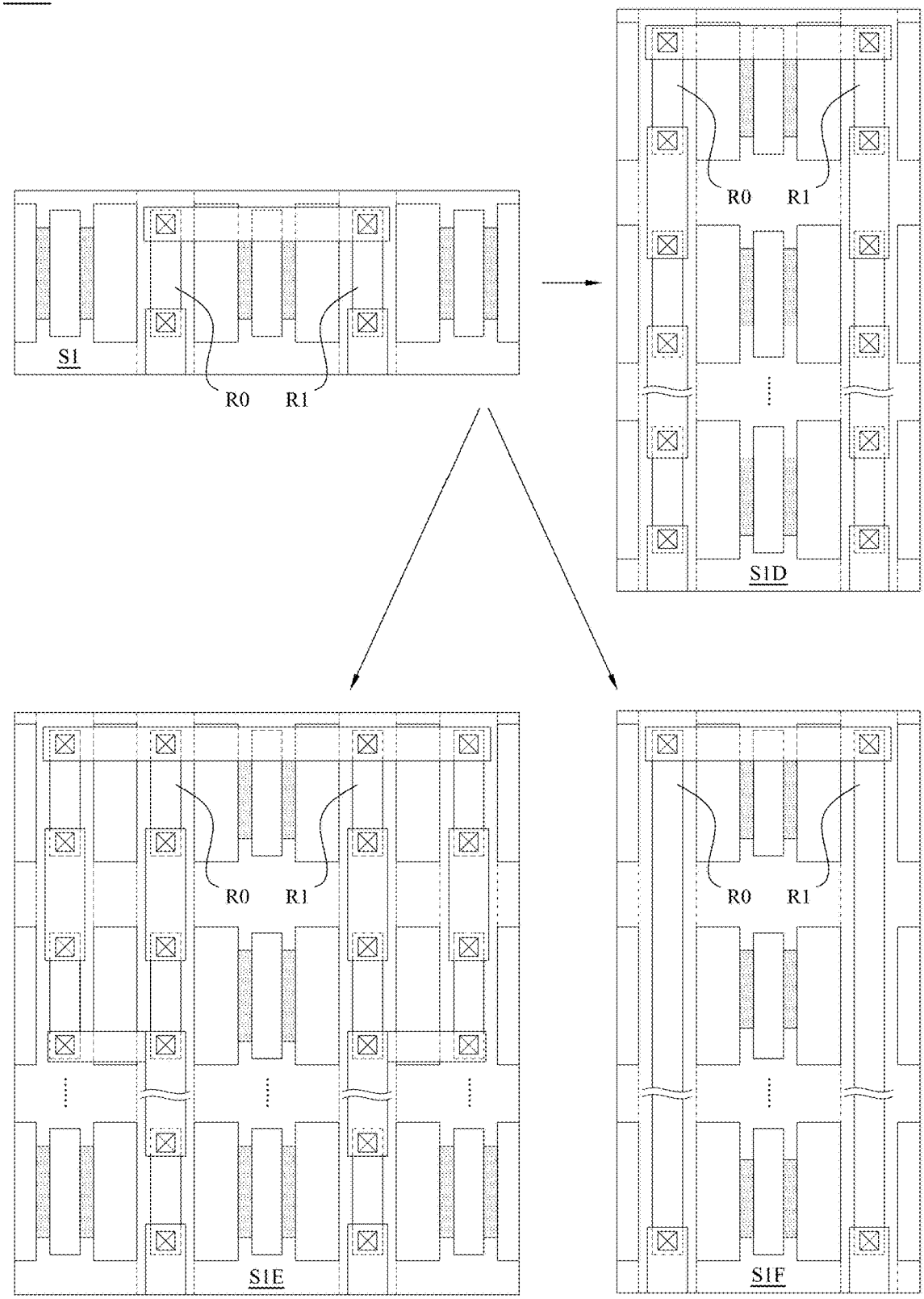

FIGS. 2E-2H are diagrams of IC device 200A, in accordance with some embodiments. As discussed below, FIG. 2E illustrates the non-limiting example of IC device 200A implemented by the configuration depicted in FIG. 1G, FIG. 2F illustrates non-limiting examples of IC device 200A including load resistors implemented in accordance with the configurations depicted in FIGS. 1D-1F, FIG. 2G illustrates a non-limiting example of IC device 200A including a parallel implementation of a MOS transistor stack, and FIG. 1H illustrates non-limiting examples of various configurations of IC device 200A.

FIGS. 2E-2H illustrate relationships between the NMOS CML circuit embodiment depicted in FIG. 2A and the implementations depicted in FIGS. 2E-2H, and are simplified for clarity accordingly, e.g., by omitting one or more labels included in the depiction of FIG. 1G.

FIG. 2E includes a schematic diagram of IC device 200A mapped (as indicated by arrows) to a simplified plan view, and further mapped to a cross-sectional view along a plane B-B' that corresponds to plane A-A' depicted in FIG. 1A. As depicted in FIG. 2E, IC device 200A includes a load resistor section S1 including load resistors R0 and R1, a switching transistor section S2 including NMOS transistors N1 and N2, and a MOS transistor stack section S3 including NMOS transistors N31-N3N. In some embodiments, dummy zone DZ surrounds each of load resistor section S1, switching transistor section S2, and MOS transistor stack section S3.

Load resistor R0 is implemented by S/D metal portion SDMR1 and corresponding vias V1 and V2 (not labeled in FIG. 2E) overlying dielectric layer FOX1 (not labeled in FIG. 2E) in load resistor section Si as shown in the plan view. Load resistor R1 corresponds to S/D metal portion SDMR5 and corresponding vias V10 and V11 and metal segments MS7 and MS8 overlying dielectric layer FOX2 (not labeled in FIG. 2E) in load resistor section S1 as shown in the plan and cross-sectional views.

NMOS transistors N1 and N2 are implemented by adjacent instances of S/D metal portions and gate structures (not labeled in FIG. 2E) in switching transistor section S2 as shown in the plan view, with NMOS transistor N2 electrically connected to load resistor R1 through via V12 in switching transistor section S2 as shown in the plan and cross-sectional views.

NMOS transistors N31-N3N are implemented by adjacent instances of S/D metal portions and gate structures (not labeled in FIG. 2E) in MOS transistor stack section S3 as shown in the plan view. NMOS transistor N32 and overlying metal segment MS10, part of the conduction path between NMOS transistor N31 and NMOS transistors N1 and N2, are positioned in MOS transistor stack section S3, as shown in the plan and cross-sectional views.

As illustrated by the non-limiting example of FIG. 2E, a CML circuit, e.g., IC device 200A, including load resistors implemented by S/D metal portions in load resistor section S1, switching transistors implemented in switching transistor section S2, and a MOS transistor stack implemented in MOS transistor stack section S3 is capable of realizing the benefits discussed above with respect to FIGS. 1A-1G. By having the configuration of switching transistor section S2 between and adjacent to both load resistor section S1 and MOS transistor stack section S3 (and surrounded by dummy zone DZ in some embodiments), the CML circuit is further capable of having improved pattern density and uniformity compared to approaches in which other structures, e.g., BEOL structures, are configured as load resistors, thereby reducing area requirements and adverse loading effects on manufacturing equipment.

FIG. 2F includes load resistor section S1 of IC device 200A mapped (as indicated by arrows) to simplified plan views S1D, S1E, and S1F corresponding to the respective configurations depicted in FIGS. 1D-1F. Compared to the single row depicted in load resistor section S1 of IC device 200A, each of the implementations depicted in plan views S1D, S1E, and S1F includes three or more rows.

In plan view S1D, each of load resistors R0 and R1 is implemented by a series connection of three or more S/D metal portions, vias, and metal segments analogous to the configuration of FIG. 1D. In some embodiments, the implementation of plan view S1D corresponds to load resistors R0 and R1 having increased resistance values compared to the implementation of load resistor section S1 of IC device 200A.

In plan view S1E, each of load resistors R0 and R1 is implemented by a parallel arrangement of two columns, each including a series connection of three or more S/D metal portions, vias, and metal segments, thereby having a configuration analogous to that depicted in FIG. 1E. In various embodiments, each of load resistors R0 and R1 is implemented by a parallel arrangement of more than two columns. In some embodiments, the implementation of plan view S1E corresponds to load resistors R0 and R1 having increased power capacity and/or decreased resistance values compared to the implementation of load resistor section S1 of IC device 200A.

In plan view S1F, each of load resistors R0 and R1 is implemented by an extended S/D metal portion and vias, and metal segments analogous to the configuration of FIG. 1F. In some embodiments, the implementation of plan view S1F corresponds to load resistors R0 and R1 having increased resistance values compared to the implementation of load resistor section S1 of IC device 200A.

Figure 2G:
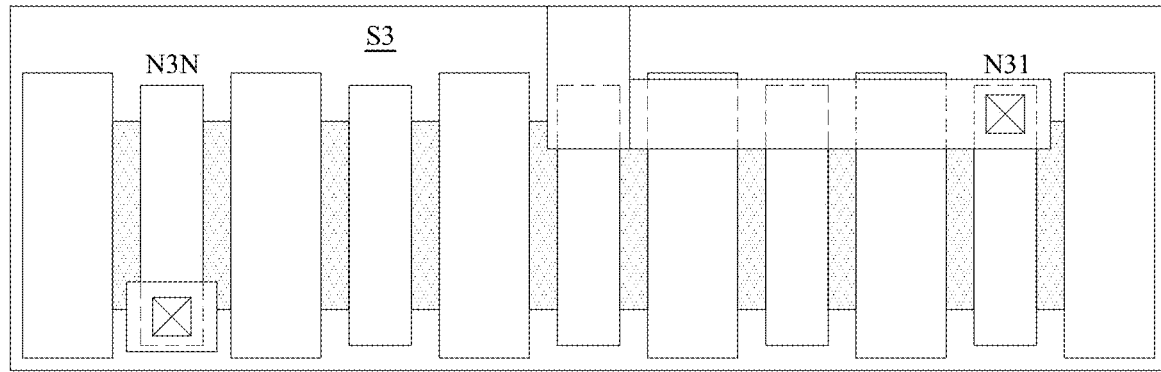
Figure 2G:
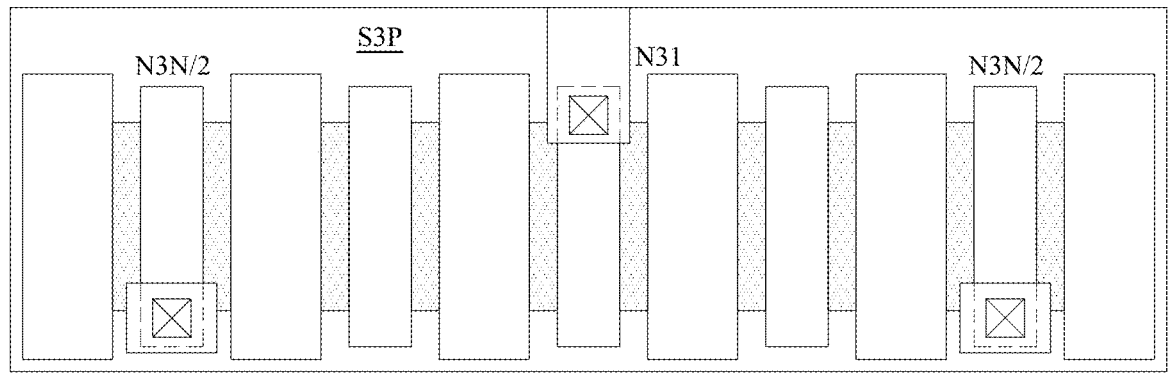

FIG. 2G includes MOS transistor stack section S3 of IC device 200A mapped (as indicated by arrow) to a simplified plan view S3P. Compared to the series transistor stack of N NMOS transistors depicted in MOS transistor stack section S3 of IC device 200A, the implementation depicted in plan view S3P includes a parallel arrangement of two series of NMOS transistors, each including N/2 NMOS transistors. In some embodiments, implementation of plan view S3P corresponds to the MOS transistor stack having decreased resistance values compared to the implementation of MOS transistor stack section S3 of IC device 200A.

Figure 2H:
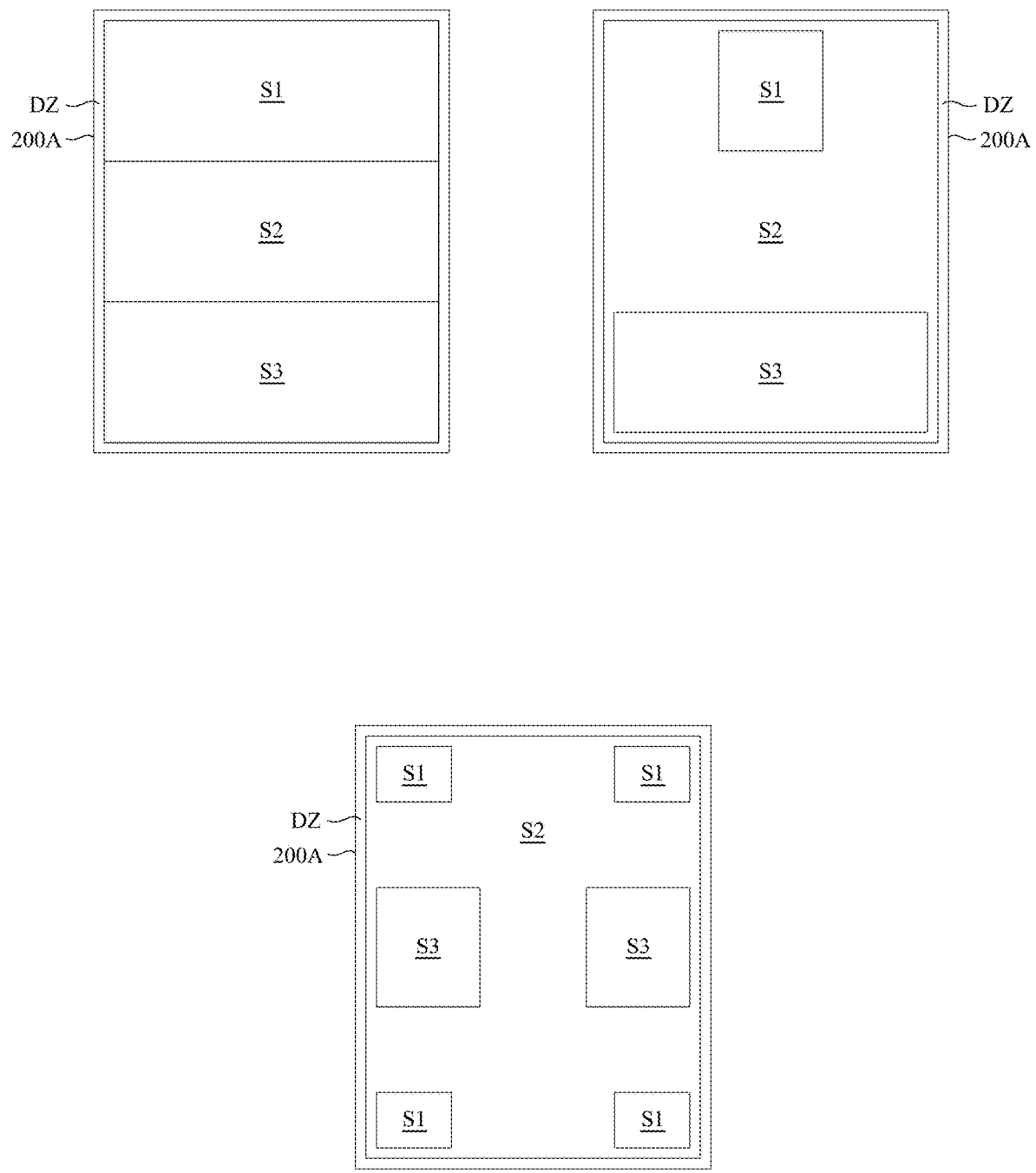

FIG. 2H includes IC device 200A having three non-limiting examples of configurations of load resistor section S1, switching transistor section S2, and MOS transistor stack section S3. A first configuration corresponds to the simplified plan view of IC device 200A depicted in FIG. 2E, in which switching transistor section S2 is positioned between and adjacent to both load resistor section S1 and MOS transistor stack section S3.

A second configuration includes switching transistor section S2 surrounding each of load resistor section S1 and MOS transistor stack section S3, and each of load resistor section S1 and MOS transistor stack section S3 is a single, continuous section within switching transistor section S2.

A third configuration includes switching transistor section S2 surrounding each of load resistor section S1 and MOS transistor stack section S3, and each of load resistor section S1 and MOS transistor stack section S3 includes multiple, separate sub-sections within switching transistor section S2.

Each of the configurations depicted in FIG. 2H is thereby capable of realizing the benefit discussed above with respect to FIG. 2E.

Figure 3:
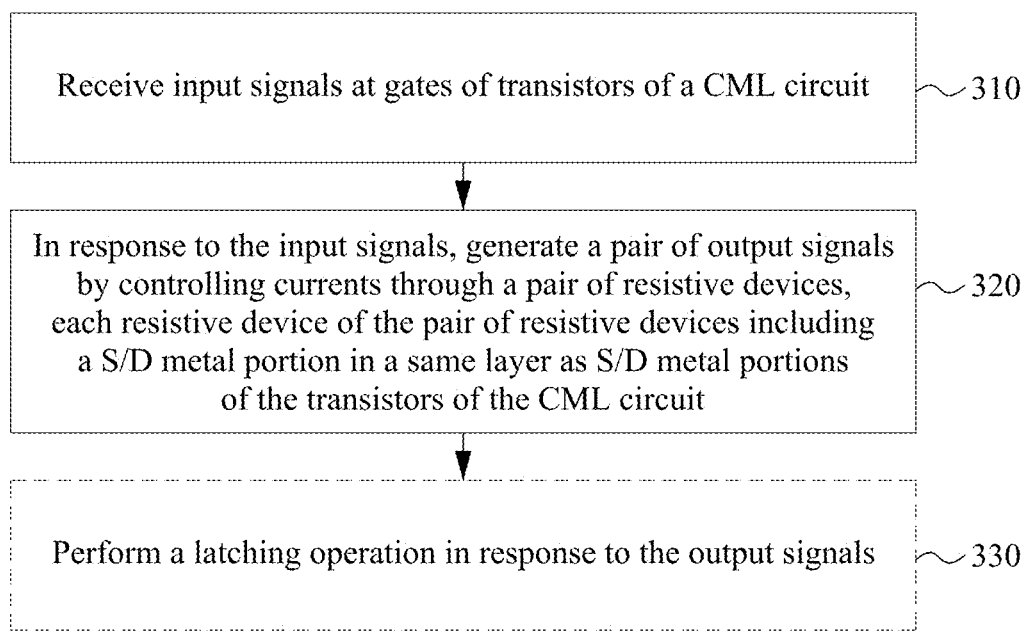
FIG. 3 is a flowchart of a method of operating an IC device, in accordance with some embodiments.

FIG. 3 is a flowchart of a method 300 of operating an IC device, in accordance with some embodiments. Method 300 is usable with an IC device, e.g., an IC device 100-200C discussed above with respect to FIGS. 1A-2C, corresponding to a CML circuit.

At operation 310, input signals are received at gates of transistors of the CML circuit. In various embodiments, receiving the input signals includes receiving input signals Ip and In at gates of respective NMOS transistors N1 and N2, discussed above with respect to IC device 200A and FIG. 2A, or at gates of PMOS transistors P2 and P3, discussed above with respect to IC devices 200B and 200C and FIGS. 2B and 2C.

In some embodiments, receiving the input signals includes receiving a bias voltage level at a gate of a current regulating transistor of the CML circuit. In various embodiments, receiving the bias voltage level includes receiving bias voltage level Vbias at the gate of NMOS transistor N3, discussed above with respect to IC device 200A and FIG. 2A, at the gate of PMOS transistor P1, discussed above with respect to IC devices 200B and 200C and FIGS. 2B and 2C, or at the gates of transistors P1 and P4, discussed above with respect to IC device 200C and FIG. 2C.

At operation 320, in response to the input signals, a pair of output signals is generated by controlling currents through a pair of resistive devices, each resistive device of the pair of resistive devices including a S/D metal portion in a same layer as S/D metal portions of the transistors of the CML circuit.

In various embodiments, generating the output signals includes generating output signals On and Op by controlling currents through load resistors R0 and R1 as discussed above with respect to IC devices 200A-200C and FIGS. 2A-2C.

In various embodiments, each resistive device including the S/D metal portion in the same layer as S/D metal portions of the transistors includes the resistive devices including S/D metal portions SDMR1 and SDMR5 in the same layer as the instances of S/D metal portions SDMX corresponding to gate structures GB3 and GB4, discussed above with respect to IC device 100 and FIG. 1G.

At operation 330, in some embodiments, a latching operation is performed in response to the output signals. In some embodiments, performing the latching operation includes performing the latching operation in response to output signals On and Op and complementary clock signals Ck and Ckb as discussed above with respect to IC device 200C and FIG. 2C.

By performing some or all of the operations of method 300, a CML circuit is operated using load resistors in which S/D metal portions are in a same layer as S/D metal portions of the transistors of the CML circuit, thereby realizing the benefits discussed above with respect to IC devices 100-200C.

Figure 4A:
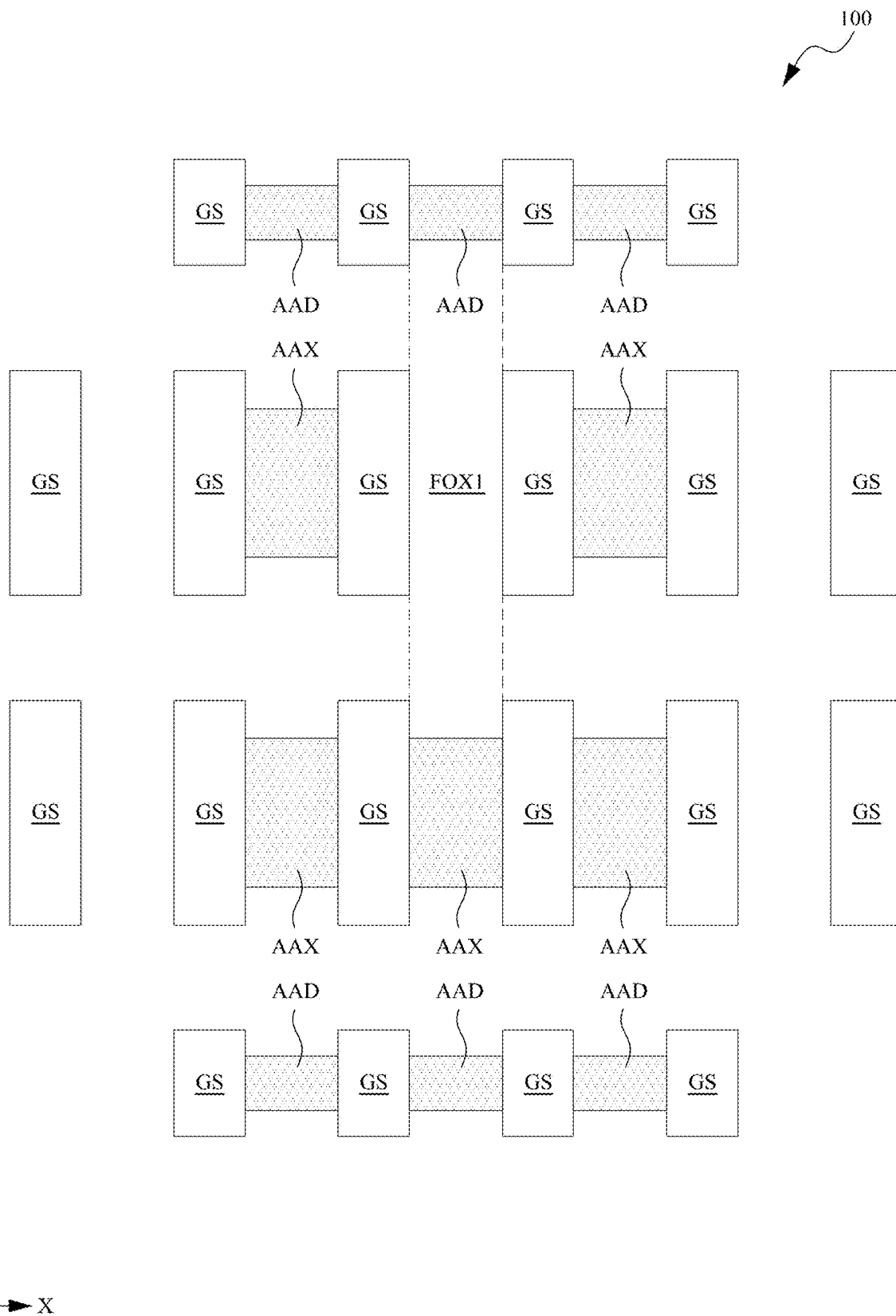
FIGS. 4A-4D are diagrams of an IC device at various manufacturing stages, in accordance with some embodiments.
Figure 4B:
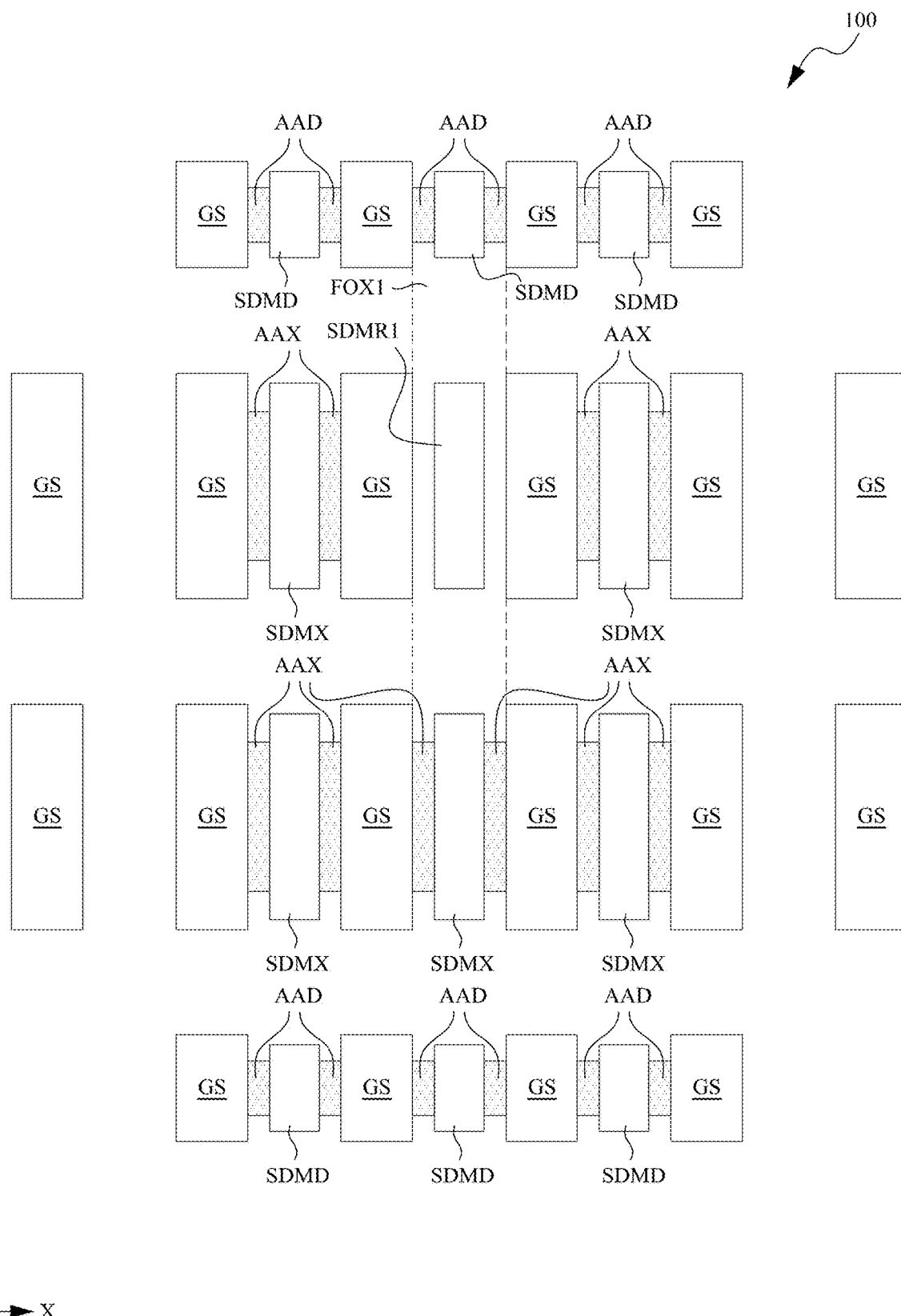
Figure 4C:
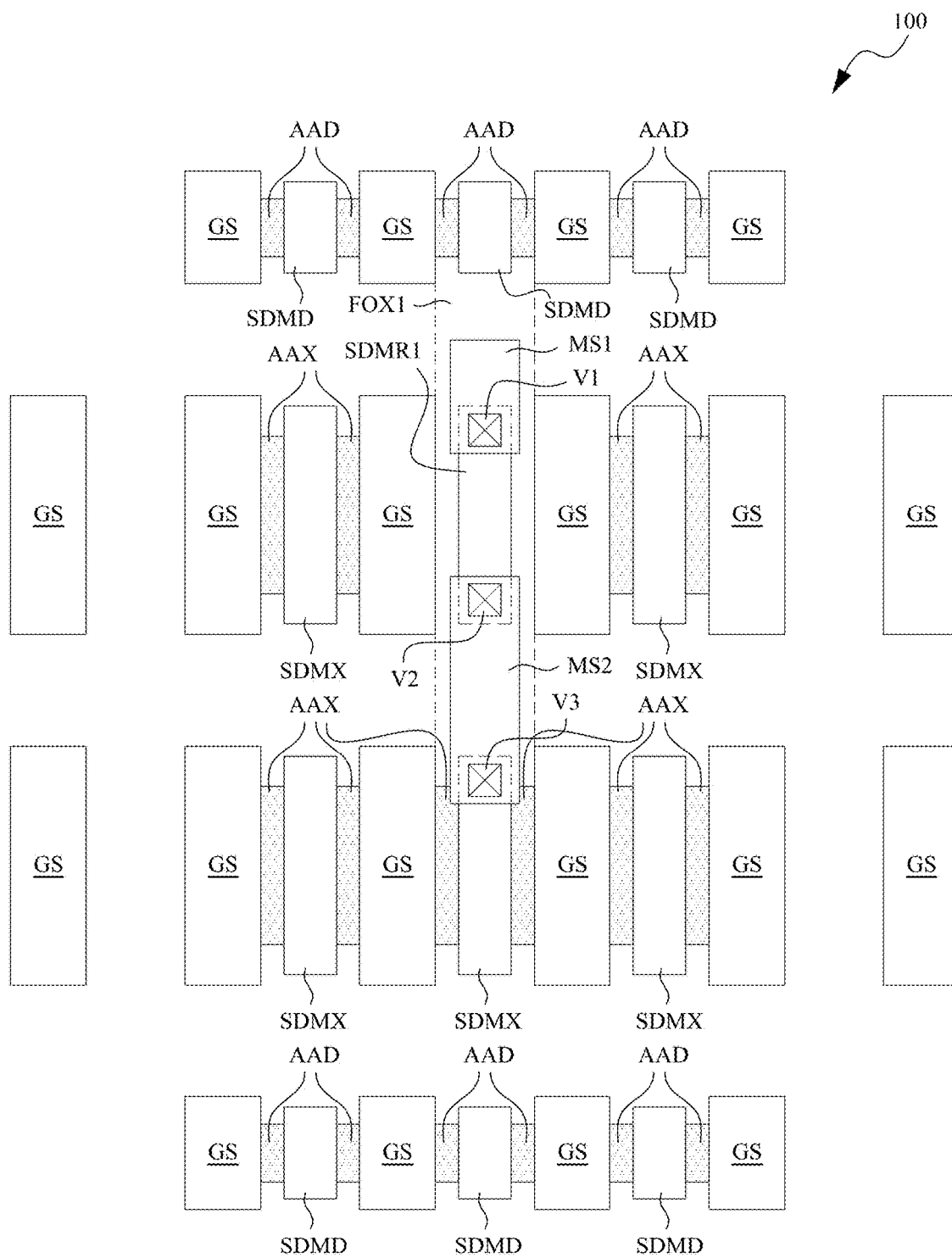
Figure 4D:
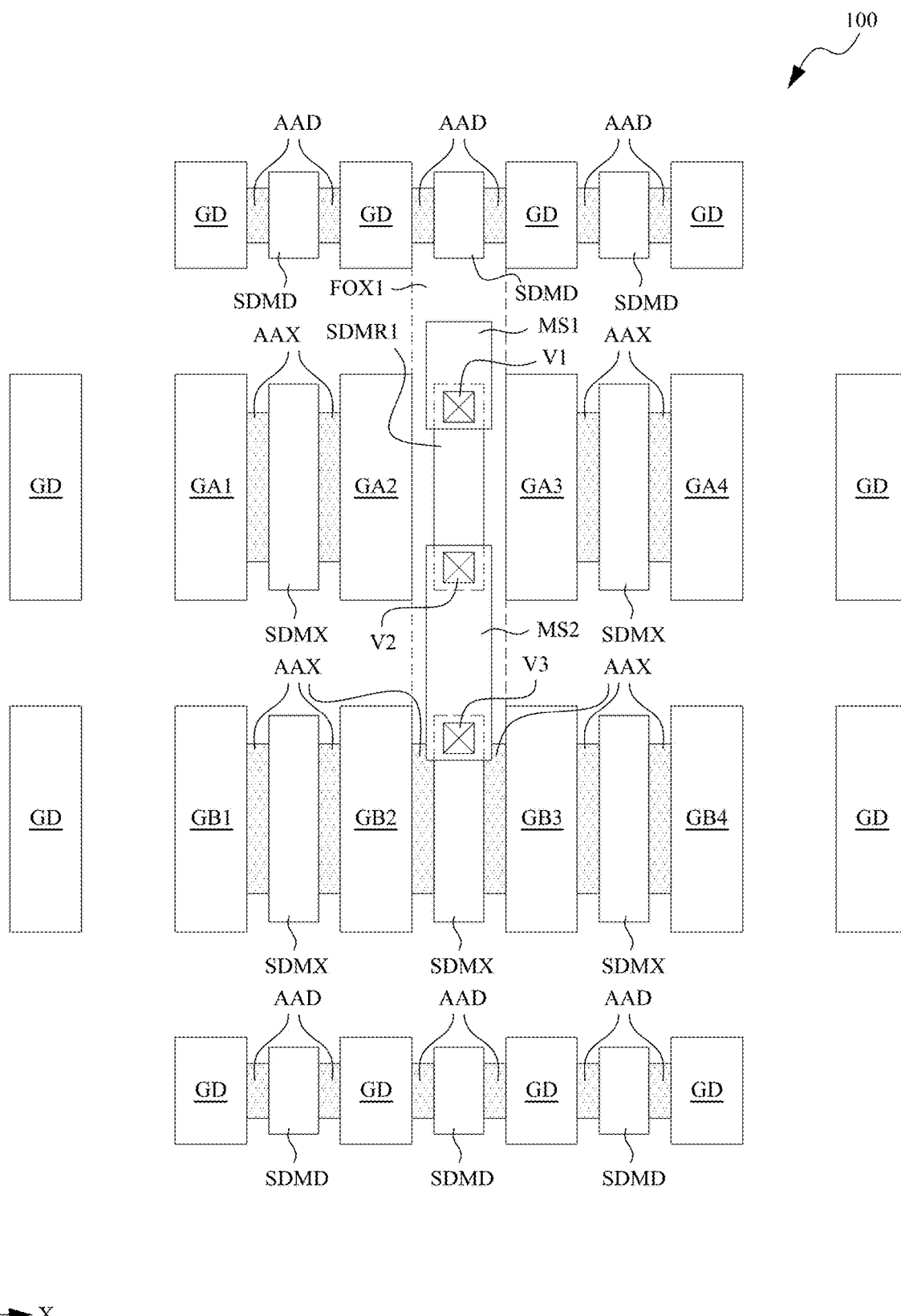
Figure 5:
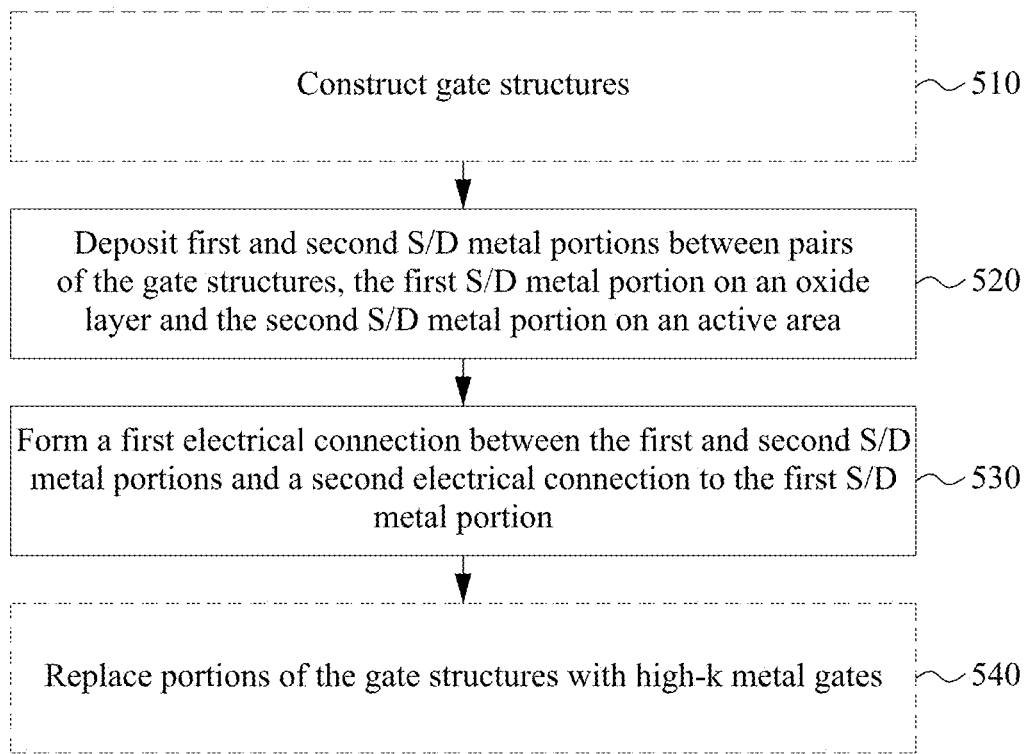
FIG. 5 is a flowchart of a method of manufacturing an IC device, in accordance with some embodiments.

FIGS. 4A-4D are diagrams of an IC device at various manufacturing stages, in accordance with some embodiments, and FIG. 5 is a flowchart of a method 500 of manufacturing an IC device, in accordance with some embodiments. The manufacturing stages represented in FIGS. 4A-4D correspond to the non-limiting example of manufacturing IC device 100 depicted in FIGS. 1A-1C and to the operations of method 500. To facilitate the illustration of the various features, the plan views depicted in FIGS. 4A-4D omit portions or all of various IC device elements, e.g., dielectric layers, spacers, or the like.

The sequence in which the operations of method 500 are depicted in FIG. 5 is for illustration only; the operations of method 500 are capable of being executed simultaneously or in sequences that differ from that depicted in FIG. 5. In some embodiments, operations in addition to those depicted in FIG. 5 are performed before, between, during, and/or after the operations depicted in FIG. 5.

At operation 510, in some embodiments, gate structures are constructed. In some embodiments, constructing the gate structures includes constructing the gate structures surrounded by a dummy zone of dummy gate structures. In some embodiments, constructing the gate structures surrounded by the dummy zone of dummy gate structures is part of constructing one or more IC features in accordance with one or more patterns designed to uniformly load manufacturing equipment.

In some embodiments, constructing the gate structures includes constructing some or all instances of gate structures GS of IC device 100 depicted in FIGS. 4A-4C. In some embodiments, constructing gate structures GS includes constructing gate structures GS different from gate structures GA1-GA4, GB1-GB4, and/or GD depicted in FIGS. 1A-1G and 4D as part of a replacement gate manufacturing process, e.g., a replacement high-k metal gate (RHMG) process. In some embodiments, constructing gate structures GS includes constructing gate structures GS the same as gate structures GA1-GA4, GB1-GB4, and/or GD.

Constructing the gate structures includes performing one or more deposition processes to form one or more dielectric material layers as discussed above with respect to FIGS. 1A-1G. In various embodiments, a deposition process includes a chemical vapor deposition (CVD), a plasma enhanced CVD (PECVD), an atomic layer deposition (ALD), or other process suitable for depositing one or more material layers.

In some embodiments, constructing the gate structures includes performing one or more deposition processes to form one or more conductive material layers as discussed above with respect to FIGS. 1A-1G. In various embodiments, constructing the gate structures includes forming gate electrodes or dummy gate electrodes.

In various embodiments, constructing the gate structures includes depositing or growing at least one dielectric layer, e.g., dielectric layer FOX1 depicted in FIGS. 4A-4D and discussed above with respect to FIGS. 1A-1G, between a first pair of adjacent gate structures and forming at least one active area, e.g., active areas AAX depicted in FIGS. 4A-4D and discussed above with respect to FIGS. 1A-1G, between a second pair of adjacent gate structures.

At operation 520, first and second S/D metal portions are deposited between pairs of the gate structures, the first S/D metal portion on the dielectric layer and the second S/D metal portion on the active area. Depositing the first and second S/D metal portions includes depositing portions of a same metal layer to form a first resistive device including the first S/D metal portion on the dielectric layer and a first transistor including the second S/D metal portion on the active area.

In some embodiments, depositing the first and second S/D metal portions includes forming S/D metal portion SDMR1 on dielectric layer FOX1 and S/D metal portion SDMX on active area AAX as depicted in FIGS. 4B-4D and discussed above with respect to FIGS. 1A-1G. In some embodiments, depositing the first and second S/D metal portions includes forming one or more of S/D metal portions SDMR2-SDMR5 discussed above with respect to FIGS. 1A-1G.

In some embodiments, depositing the first and second S/D metal portions includes depositing one or more of Cu, Ag, W, Ti, Ni, Sn, Al. In various embodiments, depositing the first and second S/D metal portions includes performing a doping operation, e.g., an implant process. In various embodiments, performing the doping operation includes using one or more of Si, SiGe, SiC, B, P, As, Ga, a metal, or another material suitable for providing a low resistance level. In some embodiments, performing the doping operation includes doping to a doping concentration of about $1*10^{16}$ per cubic centimeter (cm$^{-1}$) or greater.

At operation 530, a first electrical connection is formed between the first and second S/D metal portions, and a second electrical connection is formed to the first S/D metal portion. In some embodiments, forming the first and second electrical connections is part of forming a metal interconnect structure of the IC.

In some embodiments, forming the first and second electrical connections includes forming vias V1-V3 and metal segments MS1 and MS2 as depicted in FIGS. 4C and 4D and discussed above with respect to FIGS. 1A-1G. In some embodiments, forming the first and second electrical connections includes forming one or more of vias V4-V15 and/or metal segments MS3-MS10 as discussed above with respect to FIGS. 1A-1G.

At operation 540, in some embodiments, portions of the gate structures are replaced with high-k metal gates, e.g., as part of a RHMG process. In some embodiments, replacing the portions of the gate structures includes forming gate structures GA1-GA4, Gb1-GB4, and/or GD, depicted in FIG. 4D, from gate structures GC depicted in FIGS. 4A-4C.

The operations of method 500 are usable to form an IC device including one or more load resistors in which S/D metal portions are in a same layer as S/D metal portions of the transistors of the IC device, thereby realizing the benefits discussed above with respect to IC devices 100-200C.

Figure 6:
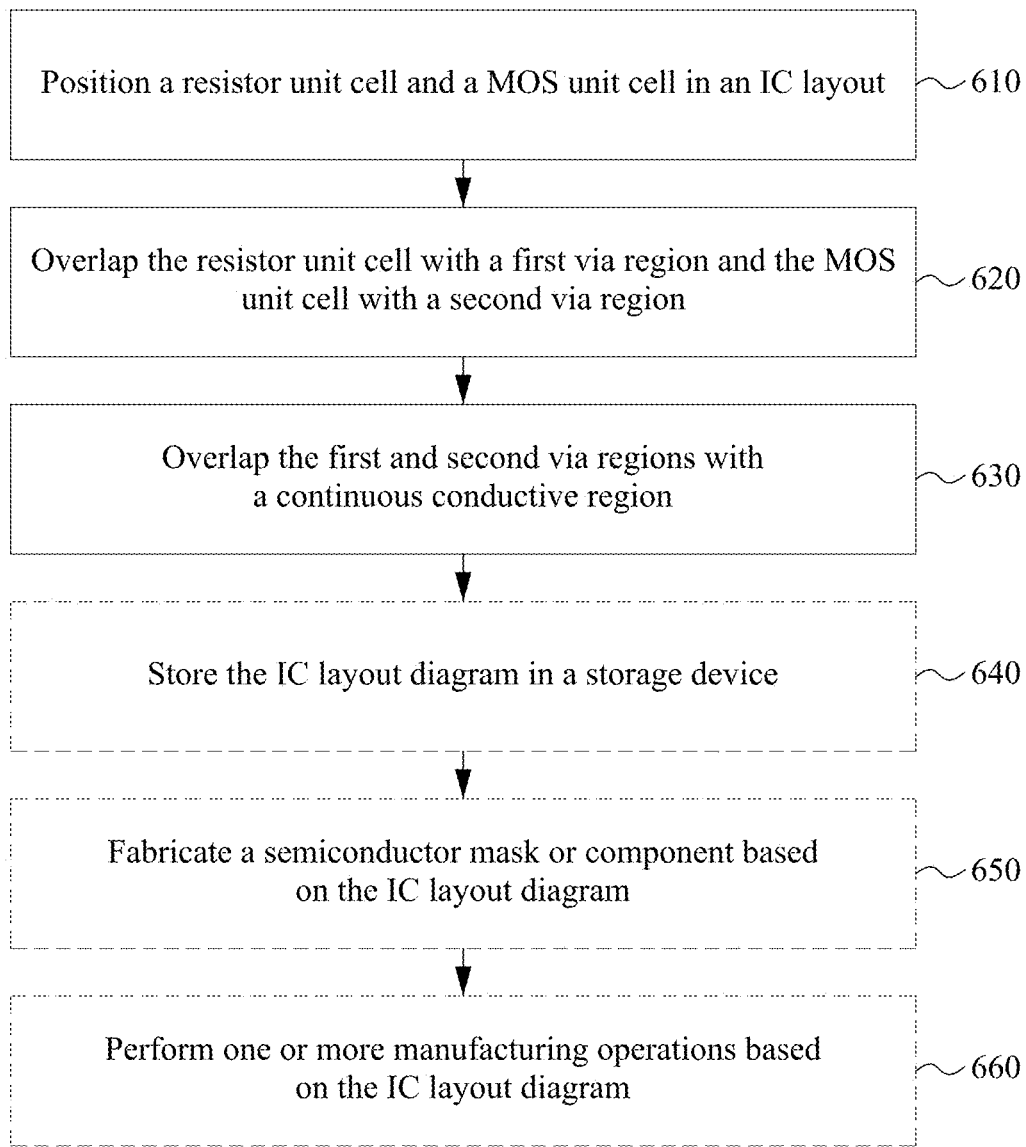
FIG. 6 is a flowchart of a method of generating an IC layout diagram, in accordance with some embodiments.

FIG. 6 is a flowchart of a method 600 of generating an IC layout diagram, in accordance with some embodiments. In some embodiments, generating the IC layout diagram includes generating one or more of IC layout diagrams 700A or 700B discussed below, corresponding to an IC device including a load resistor in which a S/D metal portion is in a same layer as a S/D metal portion of a transistor, e.g., an IC device 100-200D including one or more of S/D metal portions SDMR1-SDMRS and SDMX discussed above with respect to FIGS. 1A-2D, manufactured based on the generated IC layout diagram. Non-limiting examples of IC devices include memory circuits, logic devices, processing devices, signal processing circuits, and the like.

In some embodiments, some or all of method 600 is executed by a processor of a computer. In some embodiments, some or all of method 600 is executed by a processor 802 of an electronic design automation (EDA) system 800, discussed below with respect to FIG. 8.

In some embodiments, one or more operations of method 600 are a subset of operations of a method of forming an IC device. In some embodiments, one or more operations of method 600 are a subset of operations of an IC manufacturing flow, e.g., an IC manufacturing flow discussed below with respect to a manufacturing system 900 and FIG. 9.

In some embodiments, the operations of method 600 are performed in the order depicted in FIG. 6. In some embodiments, the operations of method 600 are performed simultaneously and/or in an order other than the order depicted in FIG. 6. In some embodiments, one or more operations are performed before, between, during, and/or after performing one or more operations of method 600.

Figure 7A:
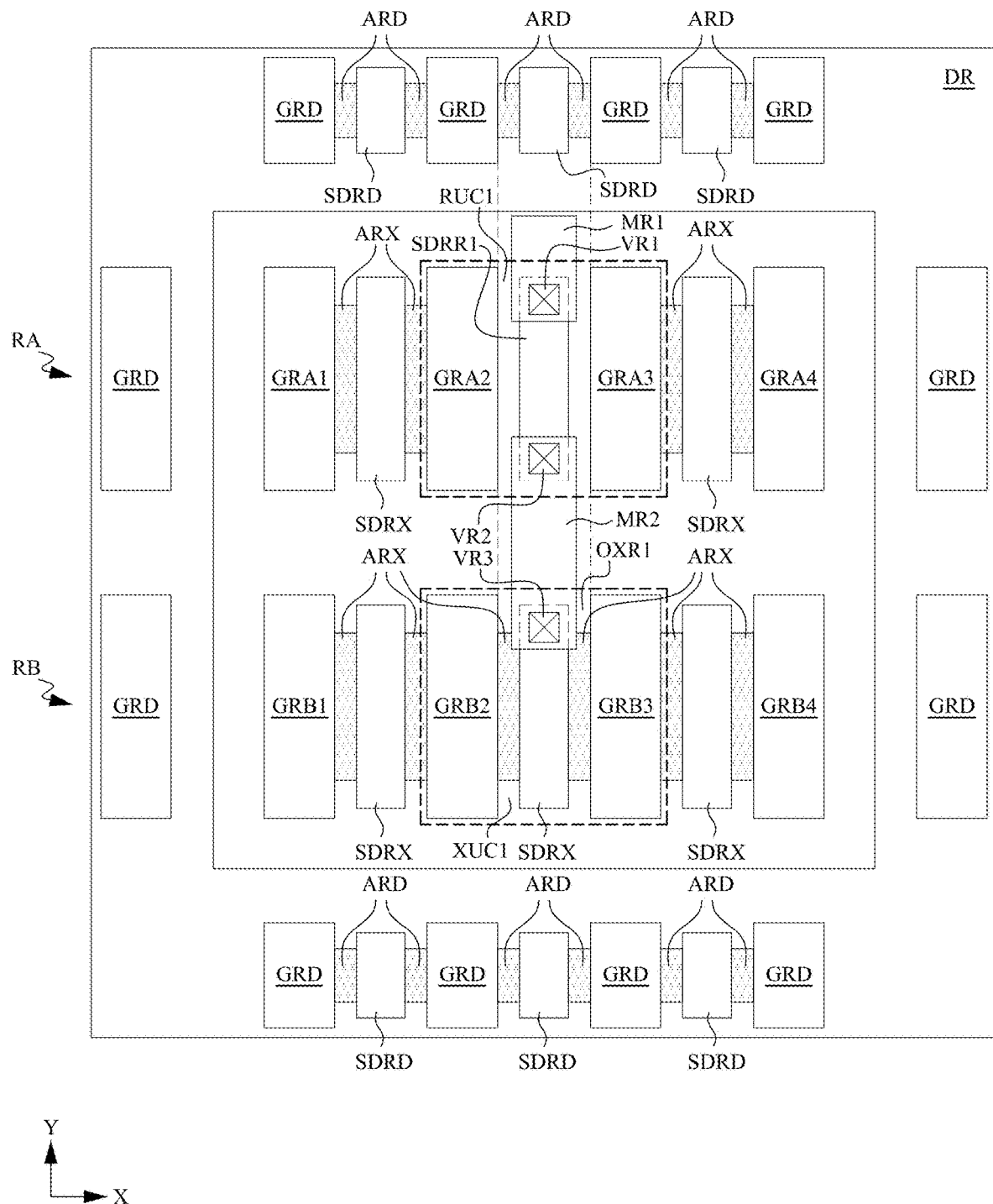
FIGS. 7A and 7B depict IC layout diagrams, in accordance with some embodiments.
Figure 7B:
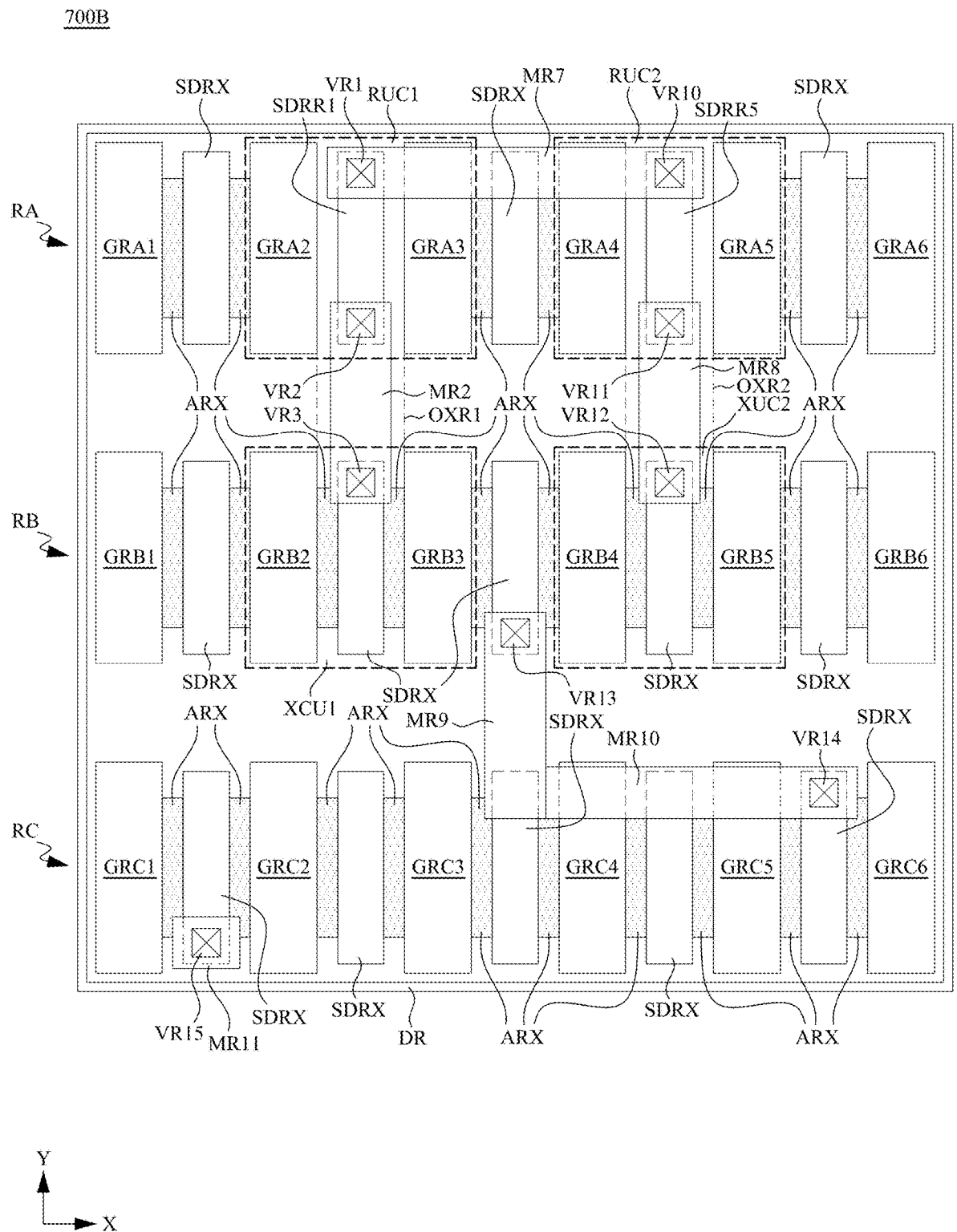

FIGS. 7A and 7B are depictions of non-limiting examples of corresponding IC layout diagrams 700A and 700B generated by executing one or more operations of method 600, in some embodiments. IC layout diagram 700A corresponds to the embodiment of IC device 100 depicted in FIGS. 1A-1C, and IC layout diagram 700B corresponds to the embodiment of IC device 100 depicted in FIG. 1G. In addition to IC layout diagram 700A or 700B, each of FIGS. 7A and 7B includes the X and Y directions, discussed above with respect to FIGS. 1A-1G and 4A-4D.

IC layout diagrams 700A and 700B are simplified for the purpose of clarity. In various embodiments, one or more of IC layout diagrams 700A or 700B includes features in addition to those depicted in FIGS. 7A and 7B, e.g., one or more transistor elements, power rails, isolation structures, wells, conductive elements, or the like. In various embodiments, each of IC layout diagrams 700A and 700B includes features that are not necessarily depicted, or only partially depicted, for the purpose of clarity.

As depicted in FIG. 7A, IC layout diagram 700A includes rows RA and RB discussed above with respect to FIGS. 1A-1G, gate regions GRA1-GRA4 in row RA and GRB1-GRB4 in row RB, active regions ARX between gate regions GRA1 and GRA2, GRA3 and GRA4, and each adjacent pair of GRB1-GRB4, a dielectric region OXR1 between gate regions GRA2 and GRA3, a S/D metal region SDRR1 overlapping dielectric region OXR1 between gate regions GRA2 and GRA3, a S/D metal region SDRX overlapping each active region ARX, via regions VR1 and VR2 overlapping S/D metal region SDRR1, a via region VR3 overlapping S/D metal region SDRX between gate regions GRB2 and GRB3, a conductive region MR1 overlapping via region VR1, and a conductive region MR2 overlapping via regions VR2 and VR3. A dummy region DR surrounds gate regions GRA1-GRA4 and GRB1-GRB4, active regions ARX, dielectric region OXR1, S/D metal regions SDRR1 and SDRX, via regions VR1-VR3, and conductive regions MR1 and MR2, and includes dummy gate regions GRD, dummy active regions ARD, and dummy S/D metal regions SDRD.

As depicted in FIG. 7B, IC layout diagram 700B includes rows RA-RC discussed above with respect to FIGS. 1A-1G, gate regions GRA1-GRA6 in row RA, GRB1-GRB6 in row RB, and GRC1-GRC6 in row RC, active regions ARX between gate regions GRA1 and GRA2, GRA3 and GRA4, GRA5 and GRA6, each adjacent pair of GRB1-GRB6, and each adjacent pair of GRC1-GRC6, dielectric region OXR1 between gate regions GRA2 and GRA3, an dielectric region OXR2 between gate regions GRA4 and GRA5, S/D metal regions SDRR1 between gate regions GRA2 and GRA3 and overlapping dielectric region OXR1, SDRR5 between gate regions GRA4 and GRA5 and overlapping dielectric region OXR2, and SDRX overlapping each active region ARX, via regions VR1 and VR2 overlapping S/D metal region SDRR1, VR3 overlapping S/D metal region SDRX between gate regions GRB2 and GRB3, VR10 and VR11 overlapping S/D metal region SDRR5, VR12 overlapping S/D metal region SDRX between gate regions GRB4 and GRB5, VR13 overlapping S/D metal region SDRX between gate regions GRB3 and GRB4, VR142 overlapping S/D metal region SDRX between gate regions GRC5 and GRC6, and VR15 overlapping S/D metal region SDRX between gate regions GRC1 and GRC2, and conductive regions MR2 overlapping via regions VR2 and VR3, MR7 overlapping via regions VR1 and VR10, MS8 overlapping via regions VR11 and VR12, MR9 overlapping via region VR13, MR10 overlapping via region VR14, and MR11 overlapping via region VR15. Dummy region DR surrounds gate regions GRA1-GRA6, GRB1-GRB6, and GRC1-GRC6, active regions ARX, dielectric regions OXR1 and OXR2, S/D metal regions SDRR1, SDRR5, and SDRX, via regions VR1-VR3 and VR10-VR15, and conductive regions MR2 and MR7-MR11, details of which are omitted in FIG. 7B for the purpose of clarity.

A gate region, e.g., one of gate regions GRA1-GRA6, GRB1-GRB6, or GRC1-GRC6, is a region in the IC layout diagram included in the manufacturing process as part of defining a gate structure in the IC device including at least one of a conductive material or a dielectric material. In various embodiments, one or more gate structures corresponding to a gate region includes at least one conductive material overlying and/or surrounding at least one dielectric material. In various embodiments, gate regions GRA1-GRA6, GRB1-GRB6, and/or GRC1-GRC6 are included in a manufacturing process as part of defining corresponding gate structures GA1-GA6, GB1-GB6, and/or GC1-GC6 discussed above with respect to FIGS. 1A-4D.

An active region, e.g., active region ARX or ARD, is a region in the IC layout diagram included in the manufacturing process as part of defining one or more active areas in the IC device, as discussed above with respect to FIGS. 1A-4D. In various embodiments, active regions ARX and/or ARD are included in a manufacturing process as part of defining active areas AAX and/or AAD discussed above with respect to FIGS. 1A-4D.

A dielectric region, e.g., dielectric region OXR1 or OXR2, is a region in the IC layout diagram included in the manufacturing process as part of defining one or more dielectric layers, e.g., a field oxide, in the IC device, as discussed above with respect to FIGS. 1A-4D. In various embodiments, dielectric regions OXR1 and/or OXR2 are included in a manufacturing process as part of defining dielectric layers FOX1 and/or FOX2 discussed above with respect to FIGS. 1A-4D.

An S/D metal region, e.g., one of S/D metal regions SDRR1, SDRR5, or SDRX, is a region in the IC layout diagram included in a manufacturing process as part of defining an S/D metal portion, on a dielectric layer or active area of a semiconductor substrate. In various embodiments, one or more of S/D metal regions SDRR1, SDRR5, or SDRX are included in a manufacturing process as part of defining one or more of S/D metal portions SDMR1-SDMR5 discussed above with respect to FIGS. 1A-4D.

A via region, e.g., one of via regions VR1-VR3 or VR10-VR15, is a region in the IC layout diagram included in the manufacturing process as part of defining a via including one or more segments of one or more conductive layers in the IC device configured to form an electrical connection between one or more underlying contacts, conductive segments, or gate structures and one or more overlying conductive segments. In various embodiments, one or more of via regions VR1-VR3 or VR10-VR15 is included in a manufacturing process as part of defining a corresponding via V1-V3 and/or V10-V15 discussed above with respect to FIGS. 1A-4D.

A conductive region, e.g., one of conductive regions MR1, MR2, or MR7-MR11, is a region in the IC layout diagram included in the manufacturing process as part of defining one or more conductive, e.g., metal, segments of a conductive layer in the IC device. In various embodiments, a conductive region corresponds to one or more of an MD layer, a via layer, a first metal layer, or a second or higher metal layer in the IC device. In various embodiments, one or more of conductive regions MR1, MR2, or MR7-MR11 is included in a manufacturing process as part of defining a corresponding conductive segment MS1, MS2, and/or MS7-MS11 discussed above with respect to FIGS. 1A-4D.

A dummy region, e.g., dummy region DR, is a region in the IC layout diagram included in the manufacturing process as part of defining one or more IC features, e.g., dummy gate structures GD, dummy active areas AAD, and/or dummy S/D metal portions SDMD discussed above with respect to FIGS. 1A-1G and 4A-4D, in accordance with one or more patterns designed to uniformly load manufacturing equipment. In some embodiments, some or all of dummy region DR is included in a manufacturing process as part of defining some or all of dummy zone DZ discussed above with respect to FIGS. 1A-1G and 4A-4D.

By the configuration depicted in FIG. 7A and discussed above, IC layout diagram 700A corresponds to the embodiment of IC device 100 depicted in FIGS. 1A-1C. By the configuration depicted in FIG. 7B and discussed above, IC layout diagram 700B corresponds to the embodiment of IC device 100 depicted in FIG. 1G.

At operation 610, a resistor unit cell and a MOS unit cell are positioned in an IC layout diagram. Positioning each of the resistor and MOS unit cells includes positioning the unit cell including at least part of a first gate region, at least part of a second gate region, and a S/D metal region between the first and second gate regions. The resistor unit cell includes information, e.g., an active area blockage layer, corresponding to manufacturing an S/D metal portion corresponding to the S/D metal region overlying a dielectric layer, e.g., a field oxide layer. The MOS unit cell includes information, e.g., a low threshold voltage layer, corresponding to manufacturing an S/D metal portion corresponding to the S/D metal region in accordance with one or more transistor design specifications. In various embodiments, the MOS unit cell information corresponds to a transistor having a minimum gate/channel length or a gate/channel length related to a minimum gate channel length by a predetermined ratio, e.g., 1.5 to 1.

In some embodiments, positioning each of the resistor and MOS unit cells includes positioning the resistor and MOS unit cells within a single dummy region, e.g., dummy region DR, of the IC layout diagram. In various embodiments, positioning each of the resistor and MOS unit cells includes positioning the resistor and MOS unit cells within a single row or in multiple rows of the IC layout diagram.

In some embodiments, positioning the resistor unit cell includes positioning a resistor unit cell RUC1, including gate regions GRA2 and GRA3, some or all of dielectric region OXR1, and S/D metal region SDRR1, in IC layout diagram 700A depicted in FIG. 7A or in IC layout diagram 700B depicted in FIG. 7B.

In some embodiments, positioning the resistor unit cell includes positioning a plurality of resistor unit cells including the resistor unit cell in the IC layout diagram. In some embodiments, positioning the plurality of resistor unit cells includes positioning resistor unit cell RUC1 and a resistor unit cell RUC2, including gate regions GRA4 and GRA5, some or all of dielectric region OXR2, and S/D metal region SDRR5, in IC layout diagram 700B depicted in FIG. 7B.

In some embodiments, positioning the resistor unit cell includes extending the S/D metal region across adjacent cell rows. In some embodiments, extending the S/D metal region across adjacent cell rows includes extending the S/D metal region corresponding to S/D metal portion SDMR1 of the embodiment of IC device 100 depicted in FIG. 1F.

In some embodiments, positioning the MOS unit cell includes positioning a MOS unit cell XUC1, including gate regions GRB2 and GRB3, some or all of one or more active regions AAX, and corresponding S/D metal region SDRX, in IC layout diagram 700A depicted in FIG. 7A or in IC layout diagram 700B depicted in FIG. 7B.

In some embodiments, positioning the MOS unit cell includes positioning a plurality of MOS unit cells including the MOS unit cell in the IC layout diagram. In some embodiments, positioning the plurality of MOS unit cells includes positioning MOS unit cell XUC1 and a MOS unit cell XUC2, including gate regions GRB4 and GRB5, some or all of one or more active regions AAX, and corresponding S/D metal region SDRX, in IC layout diagram 700B depicted in FIG. 7B.

At operation 620, the resistor unit cell is overlapped with a first via region and the MOS unit cell is overlapped with a second via region. Overlapping the resistor unit cell with the first via region includes overlapping the S/D metal region of the resistor unit cell with the first via region, and overlapping the MOS unit cell with the second via region includes overlapping the S/D metal region of the MOS unit cell with the second via region.

In some embodiments, overlapping the resistor unit cell with the first via region includes overlapping S/D metal region SDRR1 with via region VR1. In some embodiments, overlapping the MOS unit cell with the second via region includes overlapping a S/D metal region SDRX with via region VR3.

In some embodiments, overlapping the resistor unit cell with the first via region includes overlapping the S/D region of the resistor unit cell with a third via region. In some embodiments, overlapping the resistor unit cell with the third via region includes overlapping S/D metal region SDRR1 with via region VR2.

In some embodiments, overlapping the resistor unit cell includes overlapping a plurality of resistor unit cells including the resistor unit cell in the IC layout diagram. In some embodiments, overlapping the plurality of resistor unit cells includes overlapping S/D metal region SDRR5 with via region VR11.

In some embodiments, overlapping the MOS unit cell includes overlapping a plurality of MOS unit cells including the MOS unit cell in the IC layout diagram. In some embodiments, overlapping the plurality of MOS unit cells includes overlapping S/D metal region SDRX with via region VR12.

At operation 630, the first and second via regions are overlapped with a continuous conductive region. In some embodiments, overlapping the first and second via regions with the continuous conductive region includes overlapping the first and second via regions with a single conductive region. In some embodiments, overlapping the first and second via regions with the continuous conductive region includes overlapping the first via region with a first conductive region and overlapping the second via region with a second conductive region adjacent to the first conductive region.

In some embodiments, overlapping the first and second via regions with the continuous conductive region includes overlapping via regions VR1 and VR3 with conductive region MR2. In some embodiments, overlapping the first and second via regions with the continuous conductive region includes overlapping via regions VR11 and VR12 with conductive region MR8.

In various embodiments, overlapping the first and second via regions with the continuous conductive region is part of arranging a plurality of conductive regions corresponding to a metal interconnect of one or more IC devices manufactured based on the IC layout diagram.

In various embodiments, overlapping the first and second via regions with the continuous conductive region is part of arranging a plurality of conductive regions corresponding to one or more of IC devices 100 or 200A-200D as depicted in FIGS. 1A-2D.

At operation 640, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 814 of EDA system 800, discussed below with respect to FIG. 8.

At operation 650, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 9.

At operation 660, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 9.

By executing some or all of the operations of method 600, an IC layout diagram, e.g., IC layout diagram 700A or 700B, is generated including a S/D metal region overlapping a dielectric region, thereby being configured to form a S/D metal portion configured as a load resistor of an IC device manufactured based on the IC layout diagram. Method 600 is thereby usable to generate IC layout diagrams and devices having the benefits discussed above with respect to IC devices 100 and 200A-200D.

Figure 8:
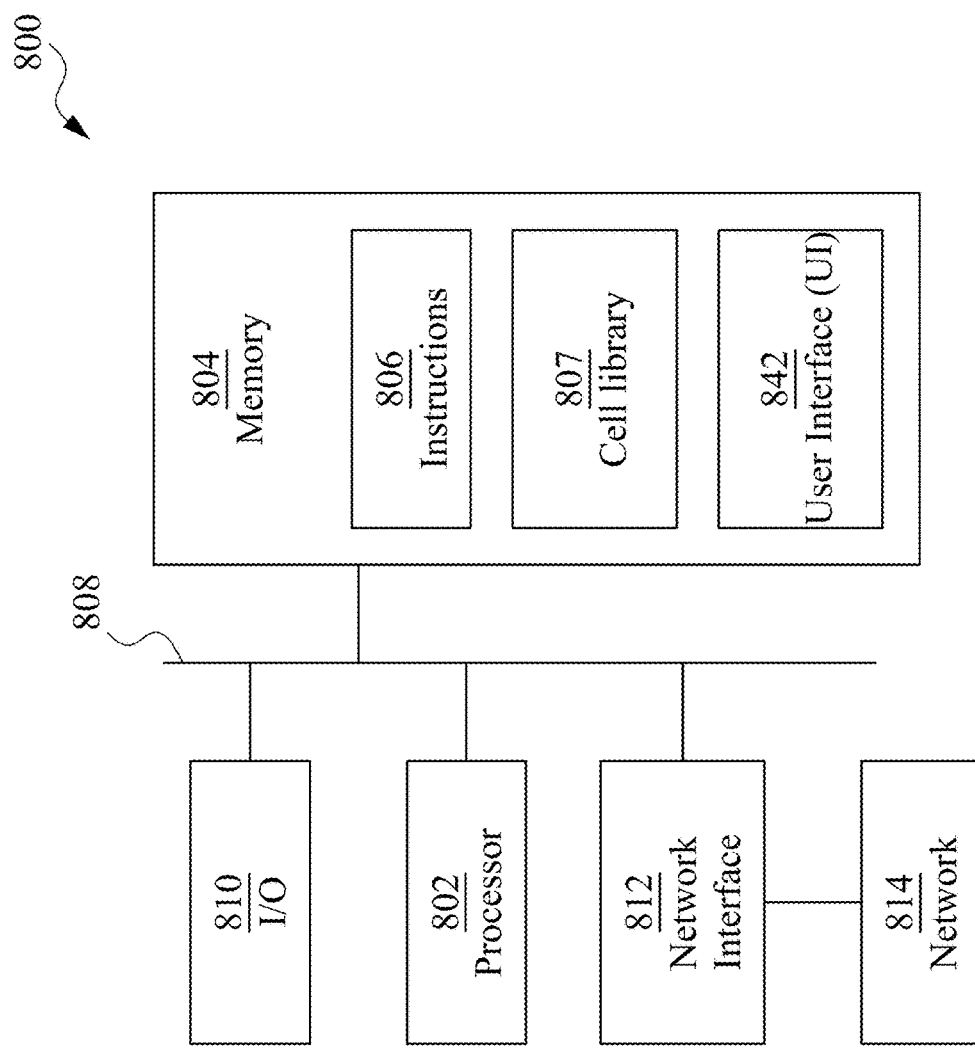
FIG. 8 is a block diagram of an electronic design automation (EDA) system, in accordance with some embodiments.

FIG. 8 is a block diagram of EDA system 800, in accordance with some embodiments.

In some embodiments, EDA system 800 includes an automated place-and-route (APR) system. Methods described herein of designing layout diagrams representing wire routing arrangements, in accordance with one or more embodiments, are implementable, for example, using EDA system 800, in accordance with some embodiments.

In some embodiments, EDA system 800 is a general purpose computing device including a processor 802 and a non-transitory, computer-readable storage medium 804, also referred to as a memory 804 in some embodiments. Computer-readable storage medium 804, amongst other things, is encoded with, i.e., stores, computer program code 806, i.e., a set of executable instructions also referred to as instructions 806 in some embodiments. Execution of computer program code 806 by processor 802 represents (at least in part) an EDA tool which implements a portion or all of a method according to an embodiment, e.g., method 600 described above with respect to FIG. 6 (hereinafter, the noted processes and/or methods).

Processor 802 is electrically coupled to computer-readable storage medium 804 via a bus 808. Processor 802 is also electrically coupled to an I/O interface 810 by bus 808. A network interface 812 is also electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, computer-readable storage medium 804 stores computer program code 806 configured to cause system 800 (where such execution represents (at least in part) the EDA tool) to be usable for performing a portion or all of the noted processes and/or methods. In one or more embodiments, computer-readable storage medium 804 also stores information which facilitates performing a portion or all of the noted processes and/or methods. In one or more embodiments, computer-readable storage medium 804 stores IC layout diagram(s) 807 including IC layout diagrams as disclosed herein, e.g., IC layout diagrams 700A and/or 700B discussed above with respect to FIGS. 6-7B.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 also includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 800.

System 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a UI through I/O interface 810. The information is stored in computer-readable medium 804 as user interface (UI) 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
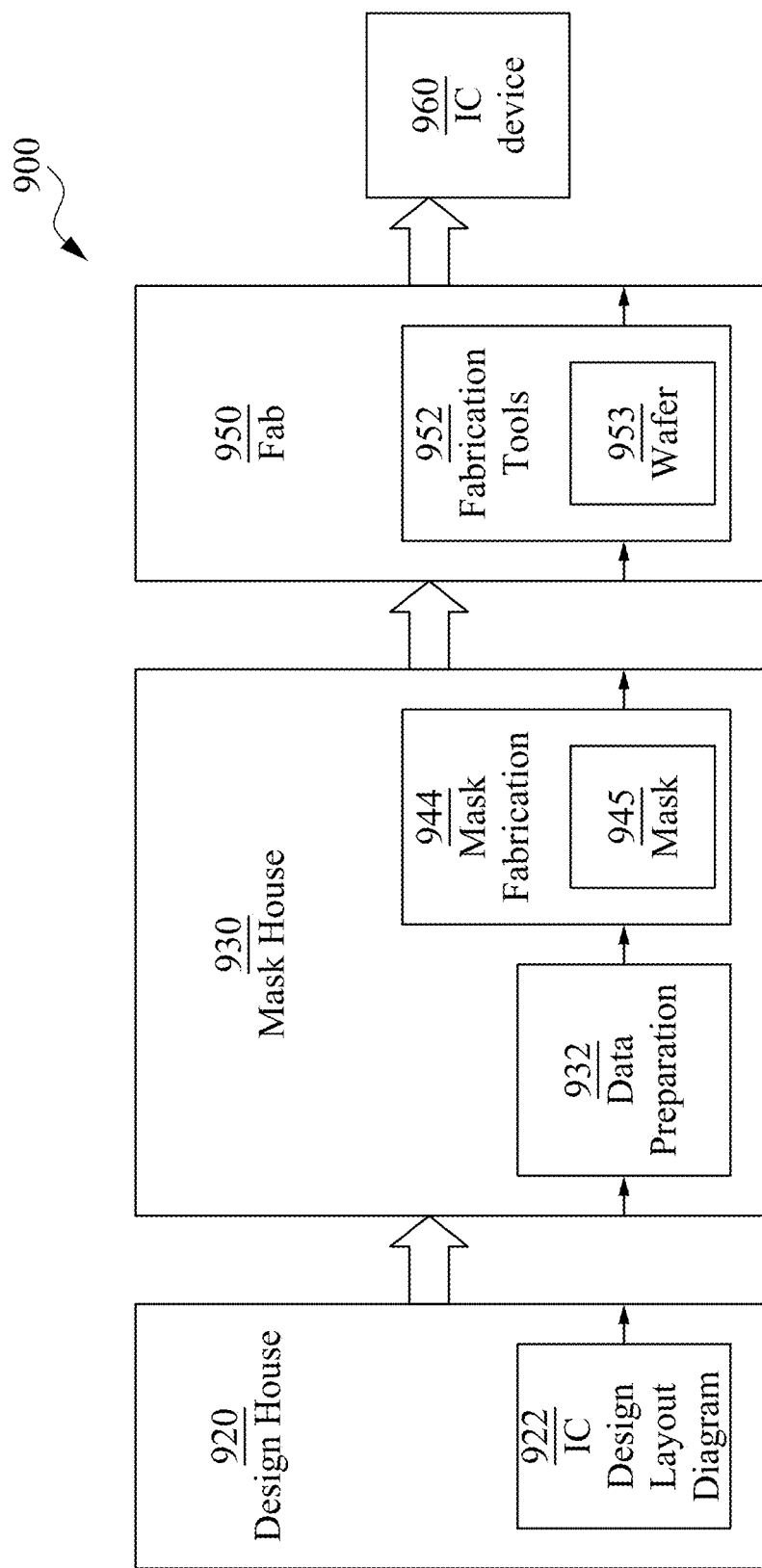
FIG. 9 is a block diagram of an IC manufacturing system, and an IC manufacturing flow associated therewith, in accordance with some embodiments.

FIG. 9 is a block diagram of IC manufacturing system 900, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout diagram 922. IC design layout diagram 922 includes various geometrical patterns, e.g., an IC layout diagram 700A or 700B discussed above with respect to FIGS. 6-7B, designed for an IC device 960, e.g., IC device 100, discussed above with respect to FIGS. 1A-3G. The geometrical patterns correspond to patterns of metal, oxide, or semiconductor layers that make up the various components of IC device 960 to be fabricated. The various layers combine to form various IC features. For example, a portion of IC design layout diagram 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout diagram 922. The design procedure includes one or more of logic design, physical design or place and route. IC design layout diagram 922 is presented in one or more data files having information of the geometrical patterns. For example, IC design layout diagram 922 can be expressed in a GDSII file format or DFII file format.

Mask house 930 includes data preparation 932 and mask fabrication 944. Mask house 930 uses IC design layout diagram 922 to manufacture one or more masks 945 to be used for fabricating the various layers of IC device 960 according to IC design layout diagram 922. Mask house 930 performs mask data preparation 932, where IC design layout diagram 922 is translated into a representative data file ("RDF"). Mask data preparation 932 provides the RDF to mask fabrication 944. Mask fabrication 944 includes a mask writer. A mask writer converts the RDF to an image on a substrate, such as a mask (reticle) 945 or a semiconductor wafer 953. The design layout diagram 922 is manipulated by mask data preparation 932 to comply with particular characteristics of the mask writer and/or requirements of IC fab 950. In FIG. 9, mask data preparation 932 and mask fabrication 944 are illustrated as separate elements. In some embodiments, mask data preparation 932 and mask fabrication 944 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout diagram 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout diagram 922 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 922 to compensate for limitations during mask fabrication 944, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout diagram 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 922.

It should be understood that the above description of mask data preparation 932 has been simplified for the purposes of clarity. In some embodiments, data preparation 932 includes additional features such as a logic operation (LOP) to modify the IC design layout diagram 922 according to manufacturing rules. Additionally, the processes applied to IC design layout diagram 922 during data preparation 932 may be executed in a variety of different orders.

After mask data preparation 932 and during mask fabrication 944, a mask 945 or a group of masks 945 are fabricated based on the modified IC design layout diagram 922. In some embodiments, mask fabrication 944 includes performing one or more lithographic exposures based on IC design layout diagram 922. In some embodiments, an electron-beam (e-beam) or a mechanism of multiple e-beams is used to form a pattern on a mask (photomask or reticle) 945 based on the modified IC design layout diagram 922. Mask 945 can be formed in various technologies. In some embodiments, mask 945 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 945 includes a transparent substrate (e.g., fused quartz) and an opaque material (e.g., chromium) coated in the opaque regions of the binary mask. In another example, mask 945 is formed using a phase shift technology. In a phase shift mask (PSM) version of mask 945, various features in the pattern formed on the phase shift mask are configured to have proper phase difference to enhance the resolution and imaging quality. In various examples, the phase shift mask can be attenuated PSM or alternating PSM. The mask(s) generated by mask fabrication 944 is used in a variety of processes. For example, such a mask(s) is used in an ion implantation process to form various doped regions in semiconductor wafer 953, in an etching process to form various etching regions in semiconductor wafer 953, and/or in other suitable processes.

IC fab 950 is an IC fabrication business that includes one or more manufacturing facilities for the fabrication of a variety of different IC products. In some embodiments, IC Fab 950 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 950 includes wafer fabrication tools 952 configured to execute various manufacturing operations on semiconductor wafer 953 such that IC device 960 is fabricated in accordance with the mask(s), e.g., mask 945. In various embodiments, fabrication tools 952 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 950 uses mask(s) 945 fabricated by mask house 930 to fabricate IC device 960. Thus, IC fab 950 at least indirectly uses IC design layout diagram 922 to fabricate IC device 960. In some embodiments, semiconductor wafer 953 is fabricated by IC fab 950 using mask(s) 945 to form IC device 960. In some embodiments, the IC fabrication includes performing one or more lithographic exposures based at least indirectly on IC design layout diagram 922. Semiconductor wafer 953 includes a silicon substrate or other proper substrate having material layers formed thereon. Semiconductor wafer 953 further includes one or more of various doped regions, dielectric features, multilevel interconnects, and the like (formed at subsequent manufacturing steps).

Details regarding an integrated circuit (IC) manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an IC device includes a transistor including a gate structure between first and second active areas, a load resistor including a first S/D metal portion overlying the first active area, and a second S/D metal portion overlying the second active area, a third S/D metal portion positioned on a dielectric layer and in a same layer as the first and second S/D metal portions, a first via overlying the first S/D metal portion, second and third vias overlying the third S/D metal portion, and a first conductive structure configured to electrically connect the first via to the second via.

In some embodiments, a CML circuit includes a first resistor including a first S/D metal portion on a first dielectric layer located between a first pair of gate structures of a first row of gate structures, a second resistor including a second S/D metal portion on a second dielectric layer located between a second pair of gate structures of the first row of gate structures, a first transistor including a first gate structure of a second row of gate structures, first and second S/D structures, a third S/D metal portion on the first S/D structure, and a fourth S/D metal portion on the second S/D structure, a second transistor including a second gate structure of the second row of gate structures, the second S/D structure, the fourth S/D metal portion, a third S/D structure, and a fifth S/D metal portion on the third S/D structure, a third transistor including a first gate structure of a third row of gate structures, fourth and fifth S/D structures, a sixth S/D metal portion on the fourth S/D structure, and a seventh S/D metal portion on the fifth S/D structure, and a fourth transistor including a second gate structure of the third row of gate structures, the fifth S/D structure, the seventh S/D metal portion, a sixth S/D structure, and an eighth S/D metal portion on the sixth S/D structure. The first resistor and first, third and fourth transistors are coupled in series, the second resistor and second, third, and fourth transistors are coupled in series, and the first through eighth S/D metal portions are in a same layer.

In some embodiments, a method of generating an IC layout diagram includes positioning a resistor unit cell in the IC layout diagram, a resistor of the resistor unit cell including a S/D metal region, positioning a MOS unit cell in the IC layout diagram, overlapping the resistor unit cell with a first via region, overlapping the MOS unit cell with a second via region, overlapping the first and second via regions with a continuous conductive region, and storing the IC layout diagram in a storage device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device comprising:
    a transistor comprising:
        a first gate structure extending in a first direction between first and second active areas;
        a first source/drain (S/D) metal portion extending in the first direction and overlying the first active area; and
        a second S/D metal portion extending in the first direction and overlying the second active area;
    a second gate structure extending in the first direction;
    a load resistor comprising a third S/D metal portion extending parallel to the second gate structure, adjacent to the second gate structure in a second direction perpendicular to the first direction, and positioned directly on a dielectric layer and in a same layer as the first and second S/D metal portions,
    wherein the first through third S/D metal portions comprise a same conductive material composition and a same height in a third direction perpendicular to the first and second directions;
    a first via overlying the first S/D metal portion;
    second and third vias overlying the third S/D metal portion; and
    a first conductive structure configured to electrically connect the first via to the second via.

2. The IC device of claim 1, wherein the first gate structure comprises a high-k dielectric material.

3. The IC device of claim 1, wherein the dielectric layer is adjacent to the first active area.

4. The IC device of claim 1, wherein the first S/D metal portion, the third S/D metal portion, and the first conductive structure are aligned along the first direction.

5. The IC device of claim 1, wherein
    the first gate structure is one gate structure of a first row of gate structures, and
    the second gate structure is one gate structure of a second row of gate structures adjacent to the first row of gate structures.

6. The IC device of claim 5, wherein the third S/D metal portion is one S/D metal portion of a plurality of S/D metal portions located between corresponding adjacent gate structures of the second row of gate structures.

7. The IC device of claim 1, wherein the load resistor further comprises:
    a fourth S/D metal portion in the same layer as the first, second, and third S/D metal portions;
    a fourth via overlying the fourth S/D metal portion; and
    a second conductive structure configured to electrically connect the fourth via to one of the second or third vias.

8. The IC device of claim 1, further comprising a second conductive structure contacting the third via.

9. A current mode logic (CML) circuit comprising:
    a first resistor comprising a first source/drain (S/D) metal portion extending in a first direction directly on a first dielectric layer located between a first pair of gate structures of a first row of gate structures aligned in a second direction perpendicular to the first direction;
    a second resistor comprising a second S/D metal portion extending in the first direction directly on a second dielectric layer located between a second pair of gate structures of the first row of gate structures;
    a first transistor comprising a first gate structure of a second row of gate structures, first and second S/D structures, a third S/D metal portion aligned with the first S/D metal portion in the first direction and positioned on the first S/D structure, and a fourth S/D metal portion on the second S/D structure;
    a second transistor comprising a second gate structure of the second row of gate structures, the second S/D structure, the fourth S/D metal portion, a third S/D structure, and a fifth S/D metal portion aligned with the second S/D metal portion in the first direction and positioned on the third S/D structure;
    a third transistor comprising a first gate structure of a third row of gate structures, fourth and fifth S/D structures, a sixth S/D metal portion on the fourth S/D structure, and a seventh S/D metal portion on the fifth S/D structure; and
    a fourth transistor comprising a second gate structure of the third row of gate structures, the fifth S/D structure, the seventh S/D metal portion, a sixth S/D structure, and an eighth S/D metal portion on the sixth S/D structure,
    wherein
        the first resistor and first, third and fourth transistors are coupled in series,
        the second resistor and second, third, and fourth transistors are coupled in series, and
        the first through eighth S/D metal portions are in a same layer and extend above each of the gate structures in a third direction perpendicular to each of the first and second directions.

10. The CML circuit of claim 9, wherein the second row of gate structures is adjacent to each of the first and third rows of gate structures.

11. The CML circuit of claim 9, wherein
each of the first through fourth transistors is an NMOS transistor, and
each of the first and second resistors is coupled to a conductive structure configured to carry a power supply voltage.

12. The CML circuit of claim 9, wherein
each of the first through fourth transistors is a PMOS transistor, and
each of the first and second resistors is coupled to a conductive structure configured to carry a reference voltage.

13. The CML circuit of claim 9, wherein the gate structure of each of the first through fourth transistors corresponds to a same gate length.

14. An integrated circuit (IC) device comprising:
a load resistor section comprising:
a first resistor comprising a first source/drain (S/D) metal portion extending in a first direction directly on a first dielectric layer located between a first pair of gate structures in a first row of gate structures aligned in a second direction perpendicular to the first direction; and
a second resistor comprising a second S/D metal portion extending in the first direction directly on a second dielectric layer located between a second pair of gate structures in the first row of gate structures;
a switching transistor section comprising:
a first transistor comprising third and fourth S/D metal portions adjacent to a first gate structure in a second row of gate structures, wherein the third S/D metal portion is aligned with the first S/D metal portion in the first direction and coupled to a first terminal of the first resistor; and
a second transistor comprising fifth and sixth S/D metal portions adjacent to a second gate structure in the second row of gate structures, wherein the fifth S/D metal portion is aligned with the second S/D metal portion in the first direction and coupled to a first terminal of the second resistor; and
a transistor stack section comprising:
a plurality of transistors comprising a third transistor comprising seventh and eighth S/D metal portions adjacent to a first gate structure in a third row of gate structures, wherein the seventh S/D metal portion is coupled to each of the fourth and sixth S/D metal portions,
wherein each of the first through eighth S/D metal portions is positioned in a same layer and extends above each of the gate structures in a third direction perpendicular to each of the first and second directions.

15. The IC device of claim 14, wherein each of the first and second resistors comprises a second terminal coupled to a power supply voltage node configured to carry a power supply voltage level.

16. The IC device of claim 14, wherein
the plurality of transistors comprises a fourth transistor comprising ninth and tenth S/D metal portions adjacent to a second gate structure in the third row of gate structures, and
the tenth S/D metal portion is coupled to a reference voltage node configured to carry a reference voltage level.

17. The IC device of claim 16, wherein
the plurality of transistors comprises a fifth transistor comprising eleventh and twelfth S/D metal portions adjacent to a third gate structure in the third row of gate structures, and
the twelfth S/D metal portion is coupled to the reference voltage node.

18. The IC device of claim 14, further comprising:
a dummy zone surrounding each of the load resistor section, the switching transistor section, and the transistor stack section,
wherein the dummy zone comprises gate structures in each of the first, second, and third rows of gate structures.

19. The IC device of claim 14, wherein the switching transistor section surrounds the load resistor section.

20. The IC device of claim 14, wherein the switching transistor section surrounds the transistor stack section.

* * * * *